(12) United States Patent
Nishizawa et al.

(10) Patent No.: US 7,291,903 B2
(45) Date of Patent: Nov. 6, 2007

(54) MEMORY CARD

(75) Inventors: Hirotaka Nishizawa, Fuchu (JP); Kenji Osawa, Hachioji (JP); Junichiro Osako, Kodaira (JP); Tamaki Wada, Higashimurayama (JP); Michiaki Sugiyama, Tokyo (JP); Takashi Totsuka, Machida (JP)

(73) Assignee: Renesas Technology Corp., Tokyo (JP)

( * ) Notice: Subject to any disclaimer, the term of this patent is extended or adjusted under 35 U.S.C. 154(b) by 30 days.

(21) Appl. No.: 11/113,188

(22) Filed: Apr. 25, 2005

(65) Prior Publication Data
US 2005/0253239 A1 Nov. 17, 2005

(30) Foreign Application Priority Data
Apr. 26, 2004 (JP) ............................. 2004-129602
Sep. 3, 2004 (JP) ............................. 2004-257244

(51) Int. Cl.
*H01L 23/02* (2006.01)
*G06K 21/00* (2006.01)
*H05K 1/18* (2006.01)
*H01R 13/73* (2006.01)

(52) U.S. Cl. ...................... 257/679; 235/492; 361/725; 361/727; 361/737; 439/948

(58) Field of Classification Search ................ 257/679; 235/492; 361/737, 725–727, 752, 796, 797; 439/946, 159, 948
See application file for complete search history.

(56) References Cited

U.S. PATENT DOCUMENTS

| | | | | |
|---|---|---|---|---|
| 5,481,434 A | * | 1/1996 | Banakis et al. | 361/756 |
| 5,493,477 A | * | 2/1996 | Hirai | 361/737 |
| 5,510,959 A | * | 4/1996 | Derstine et al. | 361/816 |
| 5,574,628 A | * | 11/1996 | Persia et al. | 361/737 |
| 5,946,194 A | * | 8/1999 | Dudas et al. | 361/737 |
| 6,097,605 A | * | 8/2000 | Klatt et al. | 361/737 |
| 6,166,913 A | * | 12/2000 | Fun et al. | 361/737 |
| 6,341,728 B1 | * | 1/2002 | Kondo et al. | 235/487 |
| 6,343,018 B1 | * | 1/2002 | Takeyama et al. | 361/737 |
| 6,462,273 B1 | * | 10/2002 | Corisis et al. | 174/521 |
| D467,586 S | * | 12/2002 | Shimoda et al. | D14/436 |
| 6,700,788 B2 | * | 3/2004 | Matsushita et al. | 361/737 |
| 6,794,346 B2 | * | 9/2004 | Wick et al. | 510/238 |
| 6,851,959 B2 | * | 2/2005 | Ooya et al. | 439/159 |
| 6,865,086 B2 | * | 3/2005 | Gochnour et al. | 361/737 |
| 6,913,492 B2 | * | 7/2005 | Kuroda et al. | 439/631 |

(Continued)

FOREIGN PATENT DOCUMENTS

WO   WO 01/84490   11/2001

*Primary Examiner*—Howard Weiss
*Assistant Examiner*—Shrininvas H. Rao
(74) *Attorney, Agent, or Firm*—Miles & Stockbriedge PC

(57) ABSTRACT

This invention is to provide an ultra-miniaturized, thin-sized memory card provided with a mechanism for preventing a wrong insertion to a memory card slot. A multi-function memory card is composed of a card body and a cap for housing the card body. The card body is made of mold resin that encapsulates plural semiconductor chips mounted on a main surface of a wiring substrate. The card body is housed into the cap with the back face of the wiring substrate facing outward. Guide channels are provided at both side faces of the cap for preventing that the card is inserted upside down. Further, a convex section is provided at the trailing edge of the cap for preventing that the card is inserted in the wrong direction.

27 Claims, 26 Drawing Sheets

U.S. PATENT DOCUMENTS 6,970,359 B2 * 11/2005 Gochnour et al. .......... 361/737
D516,076 S * 2/2006 Ko ........................... D14/436
7,053,471 B2 * 5/2006 Wada et al. ................ 257/679
7,059,871 B1 * 6/2006 Hsiao ....................... 439/76.1
7,075,792 B2 * 7/2006 Tseng et al. ................ 361/737
7,110,262 B2 * 9/2006 Matsumoto et al. ........ 361/737
7,114,659 B2 * 10/2006 Harari et al. ............... 235/492

* cited by examiner

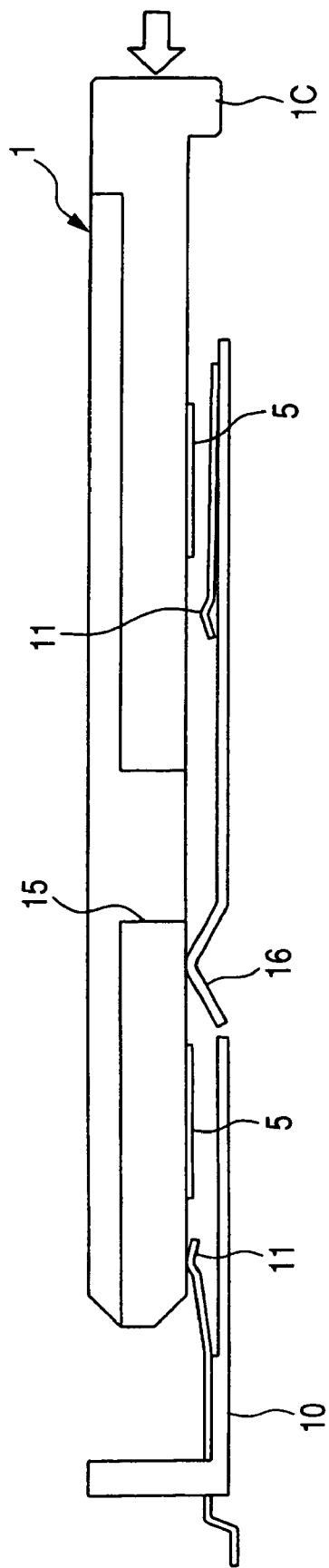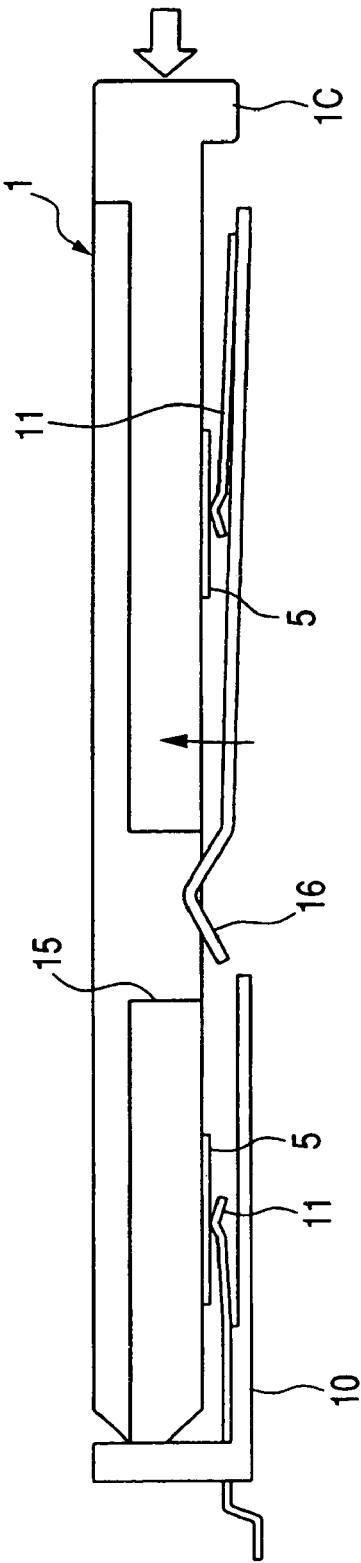

＃ MEMORY CARD

The present application claims priority from Japanese patent application No. 2004-257244 filed on Sep. 3, 2004 and No. 2004-129602 filed on Apr. 26, 2004 the content of which is hereby incorporated by reference into this application.

BACKGROUND OF THE INVENTION

The present invention relates to a memory card, and more particularly to a technique that is effectively applied to an ultra-small, thin-sized memory card used as inserted into a card slot of a communication portable terminal device such as a cellular phone.

A cellular phone has functions of Internet connection, mail transmission, image capture, navigation or the like, in addition to a function of a telephone. Recently, a security function is also added, example of which includes a non-contact IC card.

With the multi-functionalization of a cellular phone as described above, various cards in which multi-functionalization has been promoted with a miniaturization and reduction in size have also been developed in a field of a card that is used as inserted into a memory card slot of a cellular phone.

Patent International Publication No. WO01/84490 (Patent Reference 1) discloses a memory card of this type seeking a multi-functionalization. multi-functionalization.

[Patent Reference 1]
Patent International Publication No. WO01/84490

SUMMARY OF THE INVENTION

A memory card used as inserted into a memory card slot of a cellular phone generally has a configuration wherein resin-encapsulated semiconductor chips mounted on a wiring substrate are housed in a casing made of resin, like various types of memory cards. A label having a description of product name, manufacturer, memory capacity or the like is applied onto the surface of the casing, while an external connection terminal connected to a connecter terminal in the memory card slot is provided on a back surface thereof.

When the memory card of this type is inserted into a memory card of a cellular phone, users may make a mistake in the direction of the card (the direction of front or rear or the direction of front or back), so that they may frequently insert the memory card in the wrong direction. When the card is inserted in the wrong direction, the connector terminal in the slot is bent or the external connection terminal of the card and the connector terminal not corresponding to this external connection terminal erroneously come in contact with each other, thereby entailing a disadvantage of deteriorating or damaging the circuit in the semiconductor chip. In particular, miniaturizing the card makes it difficult to tell which direction is front or rear or which is front or back. Therefore, it is an essential subject to provide a mechanism capable of surely preventing the wrong insertion into the memory card slot in the development of a memory card.

Further, the memory card of this type is used by a user of a cellular phone who frequently inserts or removes the card into or from the slot. Accordingly, it is an essential subject to provide a mechanism to keep connection reliability between the connector terminal in the slot and the external connection terminal of the card for a long period of time.

Moreover, the memory card of this type requires a miniaturization and reduction in size with multi-functionalization. In order to meet the contrary demands, a technique is required in the manufacturing process of the card for mounting several semiconductor chips, each having a reduced size of not more than 100 μm by polishing its back surface, on a wiring substrate, while a development of a card structure is required wherein semiconductor chips can be laminated as much as possible within a limited size.

An object of the present invention is to provide a memory card having a mechanism capable of surely preventing a wrong insertion into a memory card slot.

Another object of the present invention is to provide a memory card that can keep connection reliability with a connector terminal at the memory card slot for a long period of time.

Still another object of the present invention is to provide a multi-function memory card having a card structure capable of increasing the number of semiconductor chips to be mounted.

The above-mentioned object and another objects and novel characteristic of the invention will be apparent from the description and accompanied drawings of this specification.

The following is a brief summary of the typical invention among the inventions disclosed in this specification.

A memory card according to the present invention comprises: a plate-like card body in which semiconductor chip mounted on the other face of a wiring substrate, having one face on which plural external connection terminals are formed, is encapsulated with resin; and a plate-like cap member having a channel for housing the card body formed on its one face, wherein the card body is housed in the channel of the cap member such that the one face of the wiring substrate is exposed, a round process is provided at both corner sections of one side of the cap member that is the leading edge upon the card insertion, a step guide channel is formed at both side sections of the cap member such that the width of the one face is different from the width of the other face and convex section projecting in the direction perpendicular to the one face is formed at the other side of the cap member that is the trailing edge upon the card insertion.

EFFECT OF THE INVENTION

The effects obtained by the typical inventions among the inventions disclosed in this application will briefly be explained hereinafter.

The invention can realize a memory card having a mechanism capable of surely preventing a wrong insertion into a memory card slot.

The invention can realize a memory card that can keep connection reliability with a connector terminal in the memory card slot for a long period of time.

The invention can realize a memory card having a card structure capable of increasing the number of laminated semiconductor chips.

BRIEF DESCRIPTION OF THE DRAWINGS

FIGS. 18(a) and (b) are views for explaining an erroneous contact preventing mechanism of the external connection terminals of the multi-function memory card according to one embodiment of the present invention and the connector terminals at the memory card slot.

BEST MODE FOR CARRYING OUT THE INVENTION

Embodiments of the present invention will be explained hereinafter in detail with reference to drawings. It should be noted that the same numerals are given to the same components for omitting the repeated explanations thereof in all drawings for explaining the embodiments.

Embodiment 1

A memory card according to this embodiment is an ultra-small, large-capacity multi-function memory card having a security function in addition to a memory function. It is used as inserted into a memory card slot such as, for example, a third-generation cellular phone.

Figure 1:
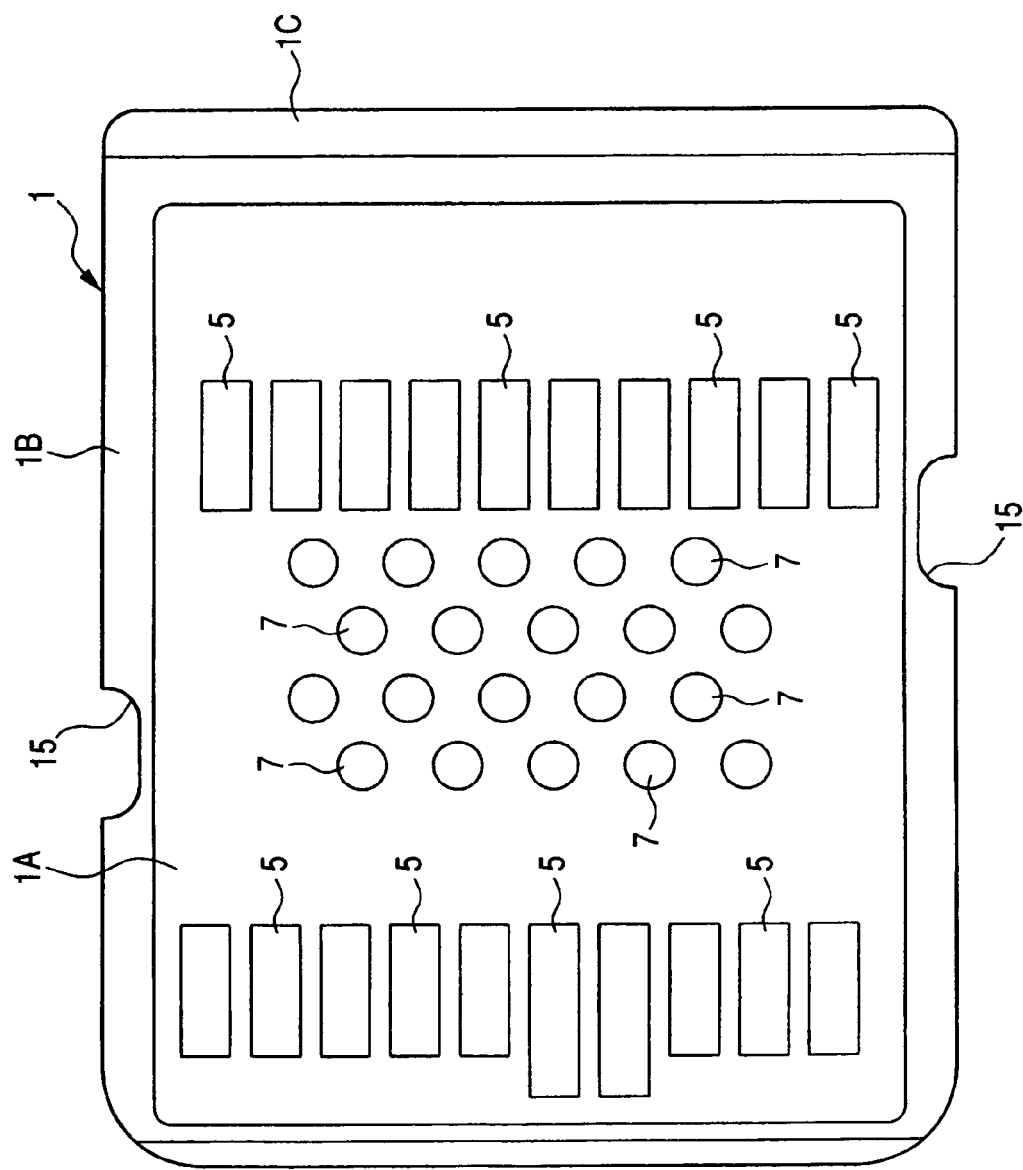
FIG. 1 is a plan view showing an outer appearance of a back face of a multi-function memory card according to one embodiment of the present invention.
Figure 2:
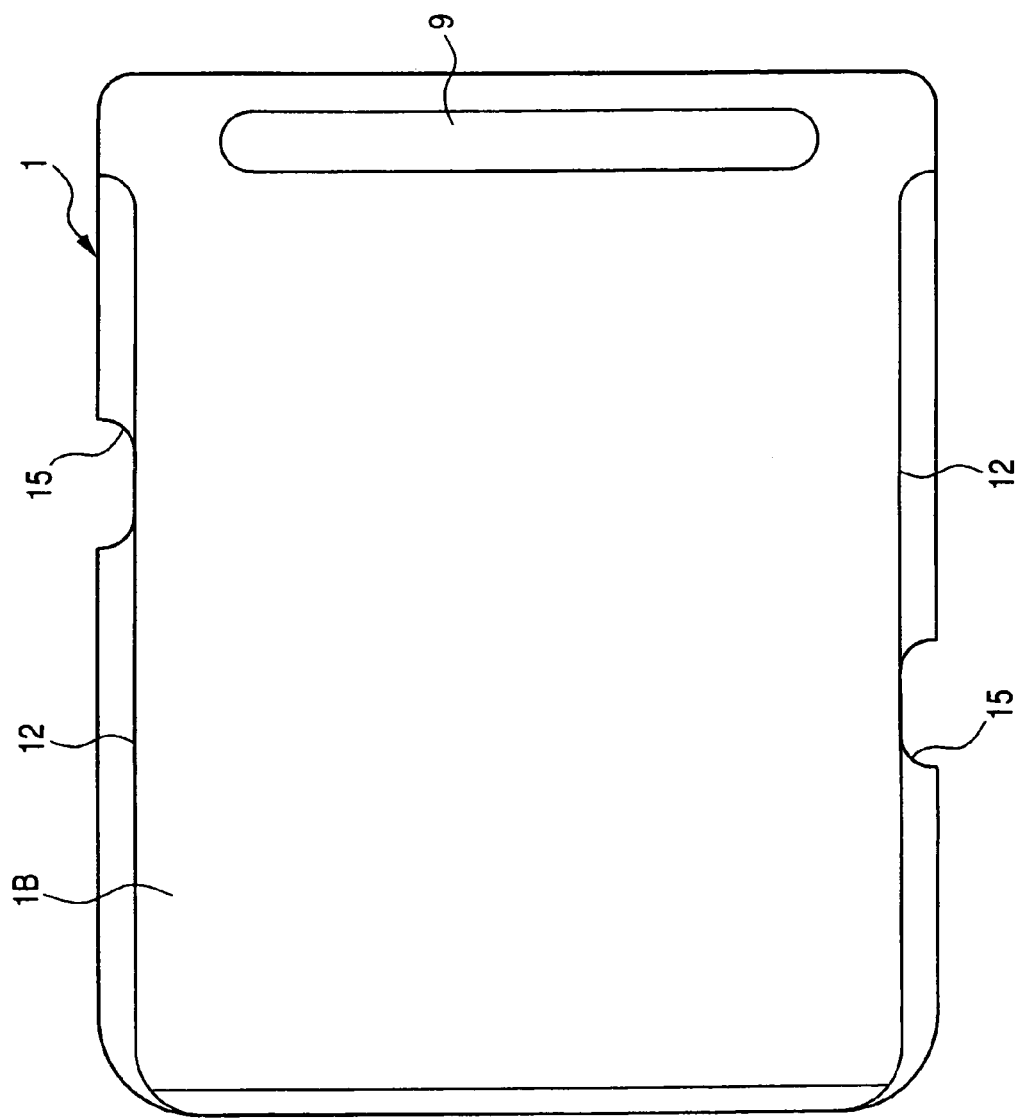
FIG. 2 is a plan view showing an outer appearance of a front face of the multi-function memory card according to one embodiment of the present invention.
Figure 3:
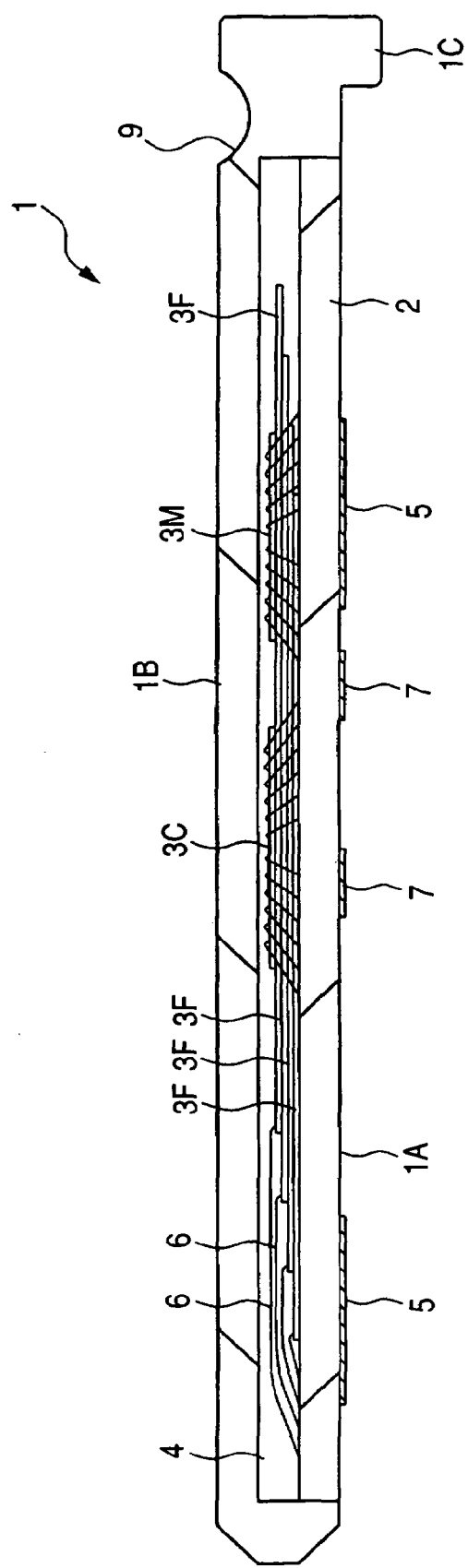
FIG. 3 is a sectional view of an essential part of the multi-function memory card according to one embodiment of the present invention.

FIGS. 1 and 2 are plan views showing an outer appearance of the multi-function memory card according to this embodiment, in which FIG. 1 shows a face on which external connection terminals are formed and FIG. 2 shows its opposite face. Further, FIG. 3 is a sectional view showing an essential part of this memory card. It should be noted that the face on which the external connection terminals are formed is referred to as a back face, while the face shown in FIG. 2 is referred to as a front face.

The multi-function memory card 1 according to this embodiment is composed of a card body 1A and a cap (casing) 1B for housing the card body. The card body 1A is composed of a wiring substrate 2 made of glass epoxy resin, plural semiconductor chips (3C, 3F, 3M) mounted on the main surface of the wiring substrate and a mold resin 4 that encapsulates these semiconductor chips (3C, 3M, 3F). The semiconductor chips (3C, 3M, 3F) and a wiring formed on the wiring substrate and not shown are electrically connected by a bonding wire 6.

Plural (e.g., twenty) external connection terminals 5 are formed on the back face of the wiring substrate 2. These external connection terminals 5 are arranged in two rows along a direction of a short side of the wiring substrate 2. Further, the external connection terminals 5 are electrically connected to the semiconductor chips (3C, 3M, 3F) via the wiring formed on the wiring substrate 2 and the bonding wire 6. Plural test terminals 7 are arranged on the back face of the wiring substrate 2 in addition to the external connection terminals 5 from the viewpoint of facilitating a test. The effective arrangement of the test terminals 7 is that the test terminals 7 are placed between the external connection terminals 5 arranged in two rows.

A channel (recess section) having a size approximately same as that of the card body 1A is formed on the back face of the cap 1B. The card body 1A is housed in this channel with the back face of the wiring substrate 2 facing toward the outside and bonded to the cap 1B with an adhesive. The depth of the channel for housing the card body 1A is approximately equal to the thickness of the card body 1A, whereby the back face of the cap 1B and the back face of the wiring substrate 2 form generally the same plane. The plane shape of the card body 1A is, for example, a rectangular having 14-mm long sides and 11-mm short sides. Further, the thickness of the card body 1A including the wiring substrate 2 and the mold resin 4 is 0.8 mm.

The mold resin 4 for encapsulating the semiconductor chips (3C, 3M, 3F) mounted on the main face of the wiring substrate 2 is made of a thermosetting epoxy resin including quartz filler. On the other hand, the cap 1B for housing the card body 1A is composed of a compact made of a thermoplastic resin having frictional resistance and hardness lower than those of the thermosetting epoxy resin composing the mold resin 4. Although not shown, a label having descriptions of a product name, manufacturer, memory capacity or the like is applied onto the front face (the face shown in FIG. 2) of the cap 1B corresponding to the front face of the multi-function memory card 1 in the case where it is an actual product. Alternately, these pieces of information may sometimes be printed on the front face of the cap 1B.

The outer dimension of the cap 1B for housing the card body 1A has 16-mm long sides and 12.5-mm short sides. A convex section 1C that is a wrong-insertion preventing mechanism for causing the multi-function memory card 1 to be inserted into the slot of the cellular phone with right direction is provided at one side (one of a pair of short sides) of the cap 1B. The convex section 1C is linearly formed from one end to the other end of this side and has a thickness of 0.7 mm.

The thickness of the cap 1B is 1.6 mm at the section where the convex section 1C is provided and 1.2 mm at the section for housing the card body 1A. The card body 1A is covered with the cap 1B, so that the size of the multi-function memory card 1 is equal to the size of the cap 1B. As described above, the multi-function memory card composed of the card body 1A and the cap 1B is extremely small and thin in size having 16-mm long sides, 12.5 mm-short sides and 1.2 mm thick (1.6 mm only at the section where the convex section 1C is formed).

The manufacture of the multi-function memory card 1 uses a large wiring substrate having, for example, an area several ten times the area of the wiring substrate 2. This large wiring substrate has formed thereon in a matrix plural units of wiring pattern necessary for the wiring substrate 2. Upon manufacturing the multi-function memory card 1, semiconductor chips (3C, 3M, 3F) are firstly mounted on each unit of the large wiring substrate, and then, the wiring pattern of the large wiring substrate and the semiconductor chips (3C, 3M, 3F) are electrically connected by the bonding wire 6. Subsequently, this large wiring substrate is set in a mold resin die made of an upper die and a lower die to encapsulate en bloc the semiconductor chips (3C, 3M, 3F) with the mold resin 4. Then, this large wiring substrate and mold resin 4 are cut and separated by using a dicing blade, thereby obtaining a great number of card bodies 1A having the aforesaid outer dimension and a shape of rectangular parallel-epiped. On the other hand, a thermoplastic resin is injected into a mold resin die that is different from the above-mentioned die, to thereby form the cap 1B. Thereafter, the card body 1A is housed into the channel of the cap 1B and both are bonded by an adhesive. Adopting a method wherein semiconductor chips (3C, 3M, 3F) are mounted on each unit of the large wiring substrate and resin-encapsulated en bloc, and then the large wiring substrate and mold resin 4 are diced can improve productivity of the card body 1A and reduce its manufacturing cost.

Moreover, in order to simplify the operation for bonding the cap 1B and the card body 1A, a double-faced adhesive tape is stuck on the surface of the mold resin 4 removed from the mold resin die, and then, the large wiring substrate, mold resin 4 and double-faced adhesive tape are simultaneously diced. This can provide the card body 1A in which the double-faced adhesive tape is stuck on the surface of the mold resin 4, whereby both can be bonded only by housing the card body 1A into the channel of the cap 1B. Note that it is desirable to rotate the dicing blade in the direction toward the back face of the large wiring substrate from the front face of the double-faced adhesive tape upon simultaneously dicing the large wiring substrate, mold resin 4 and the double-faced adhesive tape. This can remove the adhesive, that is adhered onto the dicing blade upon cutting the double-faced adhesive tape, from the dicing blade upon cutting the mold resin 4 and the large wiring substrate, resulting in being capable of preventing the deterioration in dicing operation due to the adherence of the adhesive on the dicing blade.

Subsequently, a system configuration of the multi-function memory card 1 according to this embodiment will be explained. The multi-function memory card 1 according to this embodiment has, for example, six semiconductor chips (3C, 3M, 3F) on one face of the wiring substrate 2 that composes a part of the card body 1A. Among six semiconductor chips (3C, 3M, 3F), one semiconductor chip 3C composes an interface controller and one semiconductor chip 3M composes an IC card microcomputer as a security controller. The remaining four semiconductor chips 3F compose a memory. Four semiconductor chips 3F composing the memory are laminated on the wiring substrate 2 and bonded to one another with an adhesive. The semiconductor chip 3C composing the interface controller and the semiconductor chip 3M composing the IC card microcomputer have areas smaller than that of the semiconductor chip 3F composing the memory, so that they are arranged side by side on the uppermost semiconductor chip 3F and bonded to the uppermost semiconductor chip 3F with an adhesive.

Figure 4:
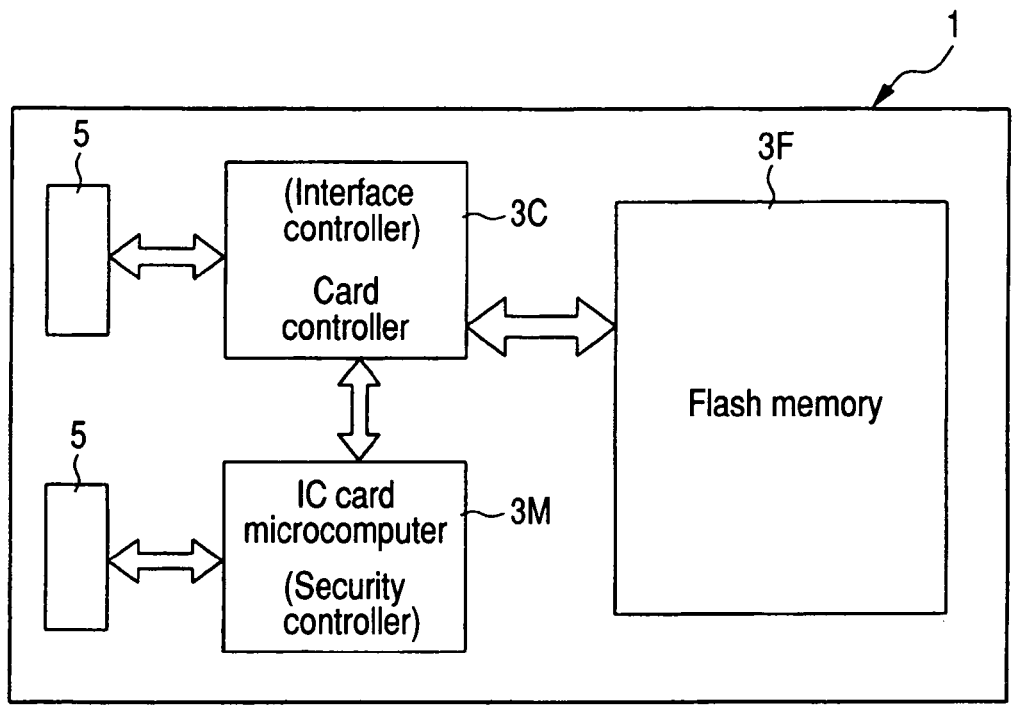
FIG. 4 is a block diagram showing a system example of the multi-function memory card according to one embodiment of the present invention.

FIG. 4 is a block diagram showing one example of the system of the multi-function memory card 1 composed of the aforesaid three types of semiconductor chips (3C, 3F, 3M). The memory formed on the semiconductor chip 3F is composed of, for example, a flash memory that is an electrically erasable and writable non-volatile memory. The memory cell of the flash memory is composed of, for example, MISFET that is a stacked gate structure having a floating gate or MISFET that is a split gate structure having a memory transistor section provided with ONO (Oxide-Nitride-Oxide) gate insulating film and a selective transistor section. The memory capacity of the flash memory formed on one semiconductor chip 3F is, e.g., 4 gigabits. Accordingly, the multi-function memory card 1 according to the embodiment having four semiconductor chips 3F has a large-capacity memory of 4 gigabits×4=2 gigabytes (16 gigabits).

The interface controller formed on the semiconductor chip 3C has plural interface control manners, wherein it controls the external interface operation and an operation of a memory interface with respect to the memory (semiconductor chip 3F) by the control manner according to the instruction from the outside. The memory card interface manner is in accordance with an interface specification of various simple memory cards. For example, the interface controller realizes a function of memory card controller by a program control for supporting the interface specification of the memory card. Moreover, it is possible to support the predetermined memory card interface specification later by adding the control program, i.e., firmware to the interface controller by downloading through a network. Further, it is possible to make the predetermined memory card interface specification unusable later by inhibiting the execution of the predetermined program by license information obtained via a network.

The aforesaid interface controller has a function of recognizing the interface control manner of the memory card interface according to the state of a command or bus received from or transmitted to the outside via the external connection terminals 5, a function of changing the width of the bus according to the recognized interface control manner of the memory card, a function of data format conversion according to the recognized interface control manner of the memory card, a power on reset function, a function of the interface control with the IC card microcomputer formed on the semiconductor chip 3M, a function of the interface control with the memory formed on the semiconductor chip 3F, a function of power supply voltage conversion, or the like.

The IC card microcomputer formed on the semiconductor chip 3M as the security controller is connected to the interface controller formed on the semiconductor chip 3C and the dedicated external connection terminal 5, wherein it performs a security process according to the signal state of this external connection terminal 5 or the operation command given from the interface controller (semiconductor chip 3C). This IC card microcomputer is provided with, for example, an authorized function by an evaluation/authentication organization of ISO/IEC 15408 that is usable for electronic settlement service. Further, it is possible to cause the IC card microcomputer to function with the memory by using the memory card interface. This allows a connection between, for example, an antenna of a cellular phone and the IC card microcomputer, thereby being capable of realizing non-contact interface similar to a non-contact type IC card, with the result that the cellular phone can be used as a commuter pass or debit card. The antenna may be formed on the surface of the wiring substrate 2 or cap 1B.

Figure 5:
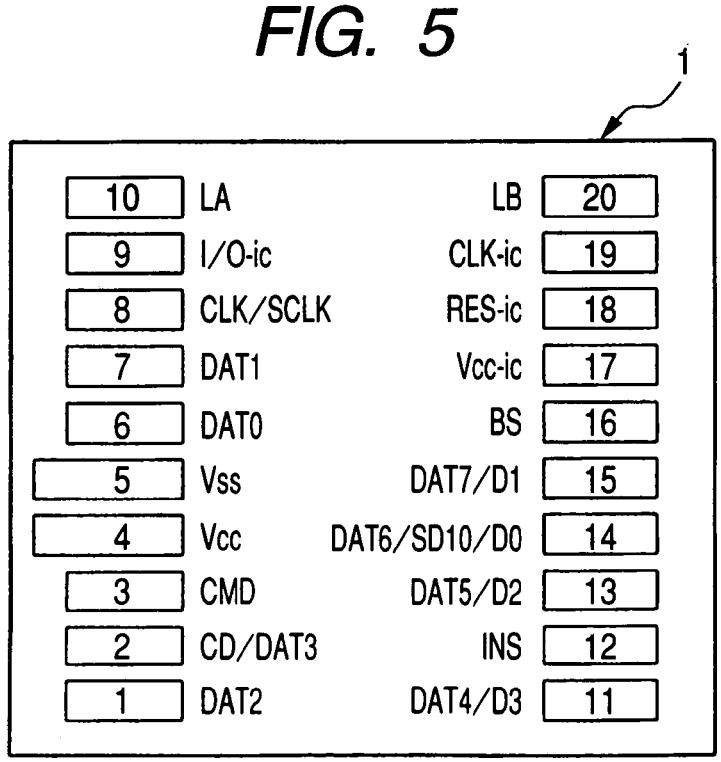
FIG. 5 is a view for explaining a function of external connection terminals of the multi-function memory card according to one embodiment of the present invention.

FIG. 5 shows one example of the function of the external connection terminals 5 arranged on the back face of the wiring substrate 2 composing a part of the card body 1A. Each of twenty external connection terminals 5 (#1 to #20) is composed of a dedicated terminal individualized for every interface control manner and a common terminal shared for every interface control manner. DAT2, DAT0, DAT1, DAT4/D3, DAT5/D2, DAT6/SDIO/D0 and DAT7/D1 are data terminals respectively. Further, CD/DAT3 is a card detect/data terminal, CMD is a command input/output terminal, Vcc is a power supply terminal, Vss is a ground terminal of a ciruit, CLK/SCLK is a clock input terminal, I/O—ic is an input/output terminal dedicated to the IC card microcomputer, LA and LB are external antenna connectors, INS is a terminal for detecting an insertion and removal, BS is a bus status terminal, Vcc—ic is a power supply terminal dedicated to the IC card microcomputer and CLK—ic is a clock input terminal dedicated to the IC card microcomputer.

The aforesaid external connection terminal 5 is composed of copper (Cu) similar to the wiring formed on the wiring substrate 2, and its surface is subject to a nickel (Ni) plating and gold (Au) plating. As shown in FIG. 1, each length of two external connection terminals 5 composing the power supply terminal (Vcc) and ground terminal (Vss) is longer than the lengths of the other external connection terminals 5. This is a configuration in which, when the multi-function card 1 is installed into the slot of the cellular phone, the power supply terminal (Vcc) and the ground terminal (Vss) are quick to be brought into contact with the terminals of the connector incorporated in the slot to supply power before various signals are supplied to the semiconductor chips (3C, 3F, 3M) through the other external connection terminals 5, thereby preventing the malfunction of the semiconductor chips (3C, 3F, 3M).

Subsequently explained is a structural feature of the multi-function memory card 1 according to this embodiment. As described above, the multi-function memory card 1 in this embodiment has a structure wherein the card body 1A composed of the wiring substrate 2 on which the semiconductor chips (3C, 3F, 3M) are mounted and the mold resin 4 encapsulating these semiconductor chips (3C, 3F, 3M) is covered with the cap 1B made of a thermoplastic resin, wherein only the back face of the card body 1A on which the external connection terminals 5 are formed is exposed to the outside.

The mold resin 4 used as a material for encapsulating the semiconductor chips (3C, 3F, 3M) includes a plenty of fillers such as quartz filler in order to decrease the difference in thermal expansion coefficient between the semiconductor chips (3C, 3F, 3M) and the mold resin 4 as described above. The resinous molded product having a plenty of inorganic fillers mixed therein has increased frictional resistance with the connector terminal and high hardness, compared to a resinous molded product having no fillers or a molded product including a small quantity of fillers. Therefore, when it rubs against the connector terminal, a problem arises that great damage is given to the connector terminal. In view of this, the multi-function memory card 1 of this embodiment has a structure in which the card body 1A is covered with the cap 1B that is made of a thermoplastic resin having hardness lower than that of the mold resin 4 and includes no filler or has filler content lower than that of the mold resin 4, whereby the mold resin 4 that is made of a thermosetting resin, has increased frictional resistance and has high hardness is not exposed at the leading edge of the card. This can establish a structure wherein the terminals of the connector incorporated in the slot does not come in contact with the mold resin 4 when the multi-function memory card 1 is inserted into the slot of the cellular phone. Specifically, the terminals of the connector contact the leading edge of the cap 1B made of a soft thermoplastic resin to displace, and then, contact the external connection terminals 5, whereby there is no chance to cause damage or abrasion that is caused when they contact the hard mold resin 4. Therefore, connection reliability between the connector terminals and the external connection terminals 5 can be kept for a long period of time. Note that a thin film made of a soft thermoplastic resin may be coated on the section of the surface of the cap 1B contacting the connector terminals as a countermeasure to prevent the damage or abrasion on the connector terminals caused by the contact to the multi-function memory card 1. In this case, the cap 1B may be molded with a thermosetting resin.

Subsequently explained is a wrong insertion preventing mechanism when the multi-function memory card 1 according to this embodiment is installed to the slot of the cellular phone.

When a memory card is installed to a memory card slot of a cellular phone or a digital camera, for example, users may make a mistake in the direction of the card (the direction of front or rear or the direction of a front side or back side), so that they may frequently insert the memory card in the wrong direction. If the memory card inserted in the wrong direction is inserted halfway into the slot, the user feels sure that the card is inserted in the right direction, so that the user further inserts the memory card to the end. Therefore, the connector terminals in the slot are bent or the external connection terminal of the card and the connector terminal not corresponding to this external connection terminal erroneously come in contact with each other, thereby entailing a disadvantage of deteriorating or damaging the circuit in the semiconductor chip. The multi-function memory card 1 according to this embodiment has a small outer dimension compared to the conventional memory card, so that the aforesaid wrong insertion is likely to occur. In view of this, the multi-function memory card 1 of this embodiment has a mechanism capable of surely preventing the wrong insertion as described later.

As described above, the multi-function memory card 1 of this embodiment is provided with the convex section 1C at one side of the cap 1B, so that only the section provided with the convex section 1C is thicker than the other sections. Further, since this convex section 1C is provided on only the back face of the cap 1B, the front face of the multi-function memory card 1 is flatter than the back face.

When the multi-function memory card 1 is inserted into the slot of the cellular phone, the direction of front or rear and the direction of front side or backside can correctly be judged by the confirmation of concave/convex on the surface with fingers. Further, the height of the opening section of the connector incorporated in the slot is made smaller than the thickness of the cap 1B provided with the convex section 1C, whereby there is no chance that the memory card inserted in the wrong direction goes halfway into the slot, since the convex section 1C cannot be inserted into the connector even if users may make a mistake in the direction of the card and they intend to insert the memory card in the wrong direction.

The convex section 1C provided at the cap 1B is not only useful for preventing the wrong insertion as described above but also can be utilized for removing the multi-function memory card 1 from the slot. Specifically, the multi-function memory card 1 has extremely small dimensions in length and width and further has extremely thin thickness, so that it is difficult to quickly remove the multi-function memory card 1 from the slot. However, providing the convex section 1C, that is thicker than the other section, at one part of the cap 1B allows the convex section 1C to expose to the outside of the connector even when the multi-function memory card 1 is installed to the slot, whereby the multi-function memory card 1 can quickly be removed from the slot by pinching and pulling the convex section 1C by fingers. In this case, providing an elongated channel 9 on the front face of the multi-function memory card 1 at the position opposite to the convex section 1C as shown in FIGS. 2 and 3 further facilitates the removal from the slot. Moreover, the sectional shape of the convex section 1C at the corner section at the terminal side is processed to be round or chamfered. The removal operation of the card becomes easier as the size of the round-processed section or chamfered section of the convex section 1C at the corner section is made smaller. For example, it is preferable that the radius of curvature or the size of the chamfered section of the sectional shape of the convex section 1C at the corner section at the terminal side is made greater than the radius of curvature or chamfered section of the sectional shape of the leading edge of the card.

Although the convex section 1C can be formed on the front face (the face where the label is stuck) of the cap 1B, the multi-function memory card 1 is easier to be thin-sized if it is formed at the back face (the face where the external connection terminals 5 are exposed). In the case where the convex section 1C is formed on the front face of the cap 1B, for example, the maximum thickness of the multi-function memory card 1 becomes the total of the thickness of the cap 1B (1.6 mm) at the section where the convex section 1C is provided and the thickness of the external connection terminals 5 exposed at the back face of the cap 1B. On the other hand, when the convex section 1C is formed at the back face of the cap 1B, the maximum thickness of the multi-function memory card 1 is determined only by the thickness of the cap 1B at the section where the convex section 1C is formed. Specifically, the maximum thickness of the multi-function memory card 1 is equal to the thickness (1.6 mm) of the cap 1B at the section where the convex section 1C is formed.

Figure 6:
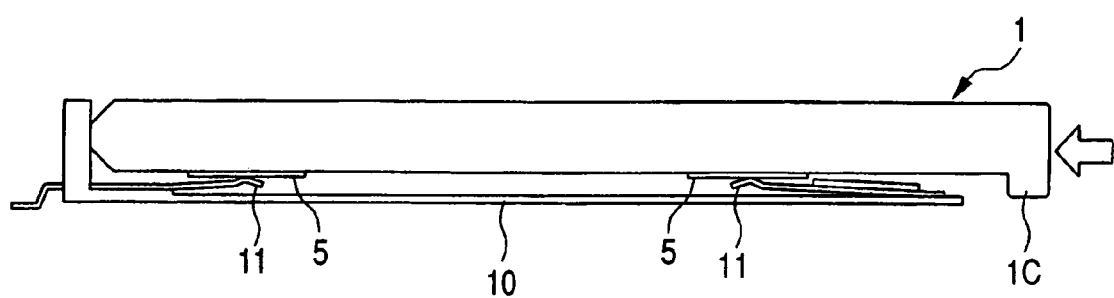
FIG. 6 is a view for explaining a positional relationship between the external connection terminals of the multi-function memory card according to one embodiment of the present invention and connector terminals at a memory card slot.
Figure 7:
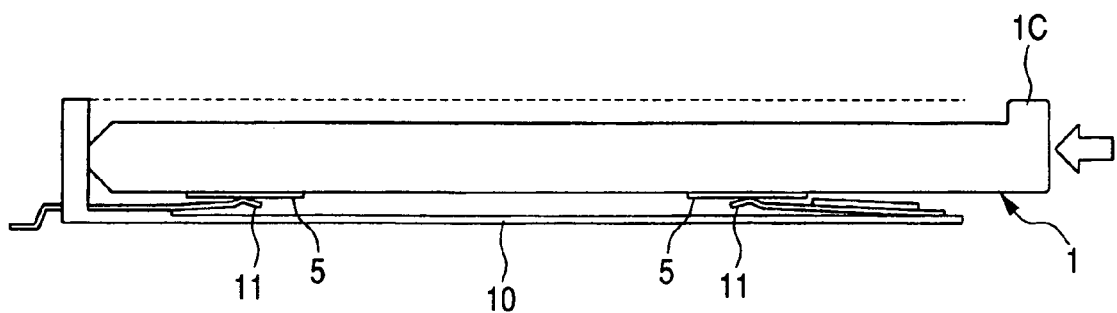
FIG. 7 is a view for explaining a positional relationship between the external connection terminals of the multi-function memory card according to a compared example and connector terminals at a memory card slot.

Further, when the convex section 1C is formed at the back face of the cap 1B, a space by which the terminals 11 of the connector can be displaced is produced between the external connection terminals 5 and the terminals 11 as shown in FIG. 6 when the multi-function memory card 1 is inserted into the slot of the cellular phone. Therefore, the deterioration of the terminal 11 can be prevented, resulting in that the connection reliability between the external connection terminals 5 and the terminals 11 can be ensured over a long period of time. On the other hand, supposing that the convex section 1C is formed at the front face of the cap 1B. In the case where a design is made with a limited connector size, it is difficult to secure the space by which the terminals 11 can be displaced between the external connection terminals 5 and the terminals 11 when the multi-function memory card 1 is inserted into the slot of the cellular phone. Accordingly, the height of the connector 10 has to be increased as shown in FIG. 7 in order to form this space, thereby making the connector 11 large-sized. Even when the multi-function memory card 1 of this embodiment is attached to a conversion adaptor to be inserted into a connector that is designed for a memory card slot of the other standard, the size of the conversion adaptor can be made small by forming the convex section 1C at the back face of the cap 1B from the same reason.

Figure 8:
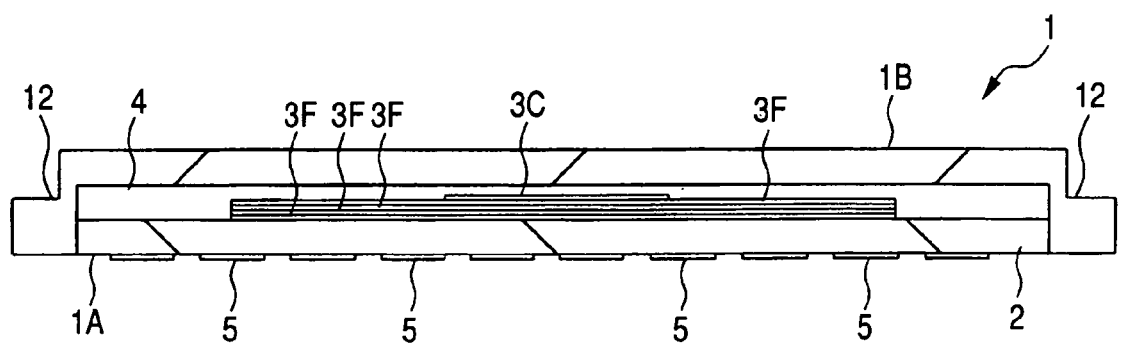
FIG. 8 is a sectional view showing a structure of a guide channel provided at the multi-function memory card according to one embodiment of the present invention.

As shown in FIG. 8 and FIG. 2, step guide channels 12 are formed at both side faces (both side faces at the long side) of the cap 1B in the multi-function memory card 1 in this embodiment. Each of the guide channels 12 is formed along the side face of the front face of the cap 1B and has a width and height of 0.55 mm respectively. Providing the guide channels 12 at both side face of the front face of the cap 1B makes the width of the front face of the cap 1B narrower than the width of the back face by 0.55 mm×2=1.1 mm. The guide channels 12 are provided for preventing that the multi-function memory card 1 is inserted upside down when it is inserted into the slot of the cellular phone.

Figure 9:
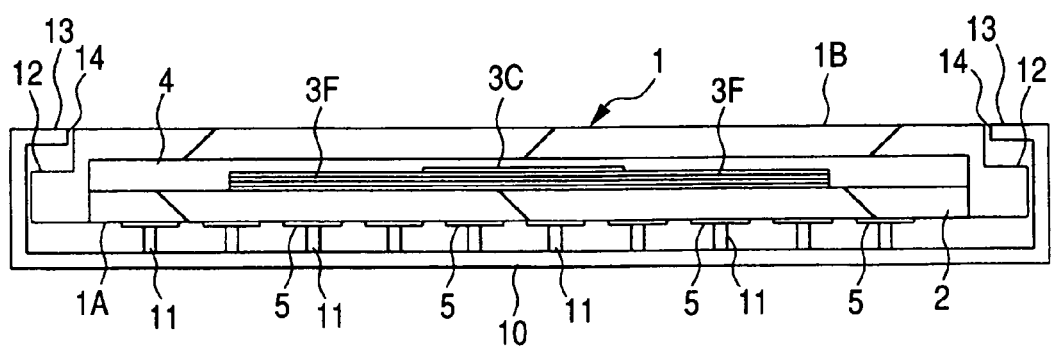
FIG. 9 is a sectional view showing a state in which the multi-function memory card according to one embodiment of the present invention is inserted into a connector at the memory card slot.

As shown in FIG. 9, a top plate 13 of the connector 10 into which the multi-function memory card 1 is inserted is provided with a cutout 14 having a width greater than the width of the cap 1B at the front face and smaller than the width of the cap 1B at the front face. The cutout 14 is provided at the top plate 13 of the connector 13, whereby, even if the user intends to insert the multi-function memory card 1 upside down into the connector 10, the back face of the cap 1B having a greater width does not go into the cutout 14, thereby being capable of surely preventing the wrong insertion.

Further, when the multi-function memory card 1 is inserted into the connector 10 provided with the above-mentioned cutout 14 at the top plate 13, the top face of the multi-function memory card 1 is equal to the top plate 13 in height. On the other hand, when the multi-function memory card 1 is inserted into another connector whose top plate is not provided with a cutout, the multi-function memory card 1 cannot be inserted into this connector unless the thickness of the multi-function memory card 1 is made smaller by the thickness of the top plate 13, supposing that the height of the connector is equal to the connector 10. Specifically, when the multi-function memory card 1 is inserted into the connector whose top plate 13 is provided with the cutout 14, the thickness of the cap 1B can be made thicker by the thickness of the top plate 13, with the result that the thickness of the card body 1A housed in the cap 1B can be made thicker by the thickness of the top plate 13. This makes it possible to increase the laminated number of the semiconductor chips mounted on the wiring substrate 2, whereby large-capacity and multi-functionalization of the multi-function memory card 1 can be promoted. When the thickness of the top plate 13 is set to be 0.15 mm to 0.2 mm, for example, the space into which two semiconductor chips having a thickness of about 70 μm to 80 μm can be laminated can be secured.

Figure 10:
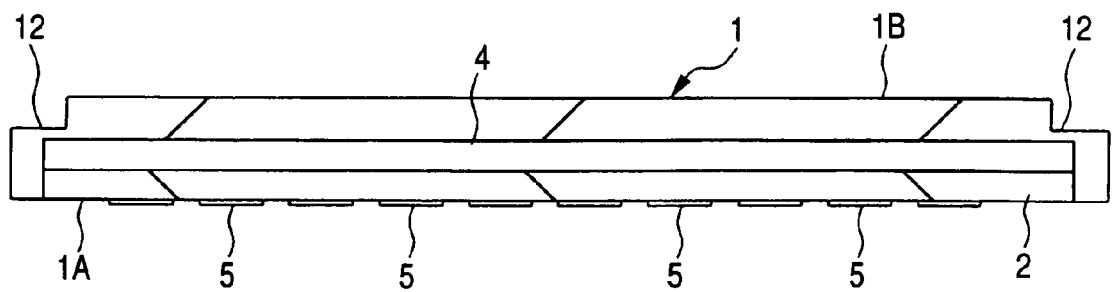
FIG. 10 is a sectional view showing one example of a position of the guide channel provided at the multi-function memory card according to one embodiment of the present invention.
Figure 11:
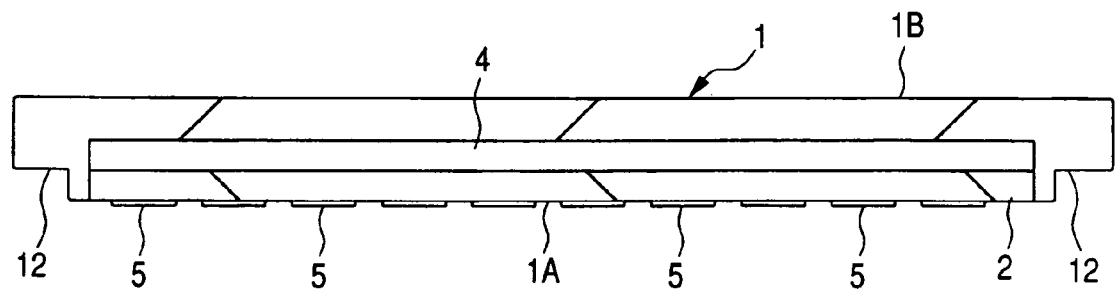
FIG. 11 is a sectional view showing another example of a position of the guide channel provided at the multi-function memory card according to one embodiment of the present invention.

The guide channels 12 at both side faces of the cap 1B can be formed on the back face of the cap 1B. However, forming the guide channels 12 on the front face is advantageous in securing a range in which the wiring substrate 2 can be accommodated, and hence, advantageous for attaining large-capacity and multi-function of the multi-function memory card 1. Specifically, when the guide channels 12 are formed on the front face of the cap 1B as shown in FIG. 10, the width of the package body 1B housed on the back face of the cap 1B is not limited by the guide channels. On the other hand, when the guide channels 12 are formed on the back face of the cap 1B as shown in FIG. 11, the width of the package body 1B housed on the back face of the cap 1B is limited, so that the area of the wiring substrate or the area of the semiconductor chip mounted on the wiring substrate are limited.

Figure 12:
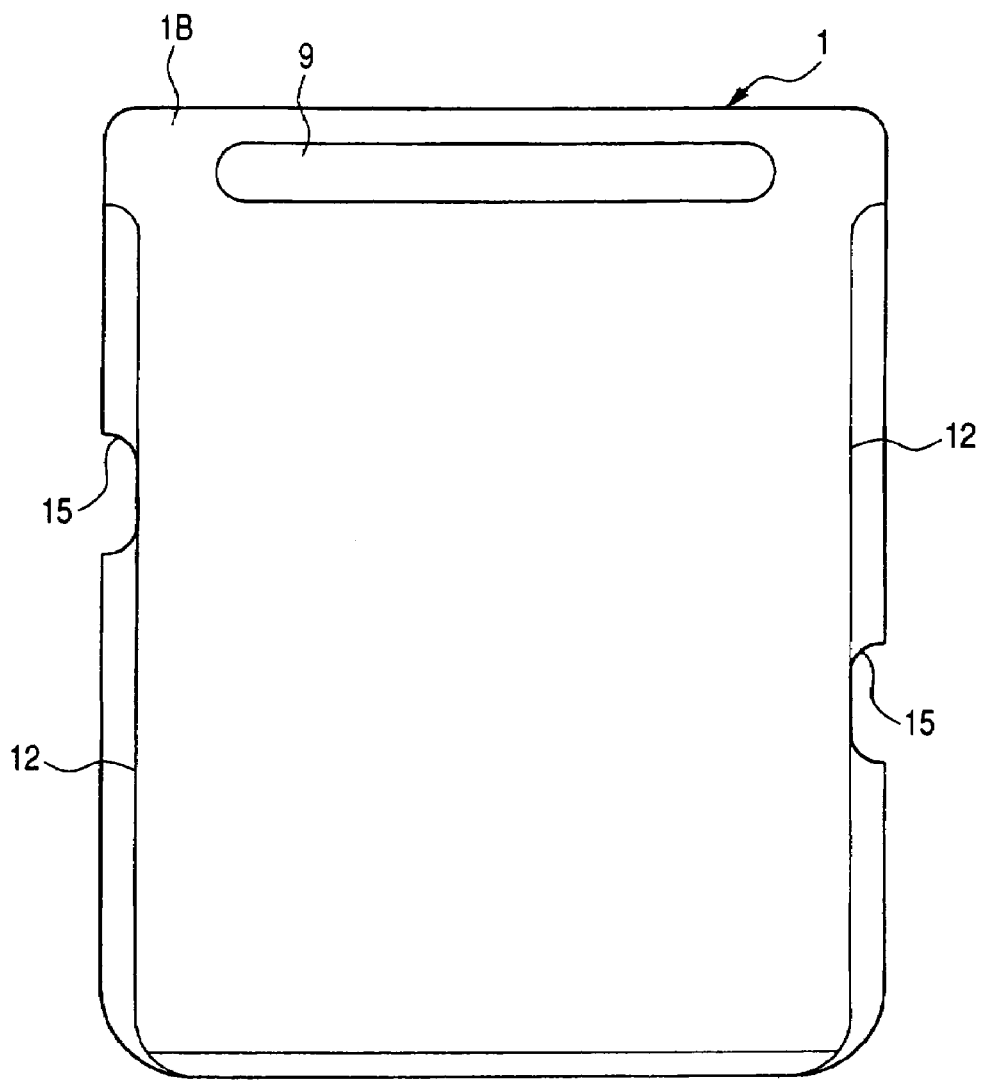
FIG. 12 is a plan view showing a front face of a multi-function memory card according to one embodiment of the present invention.
Figure 13:
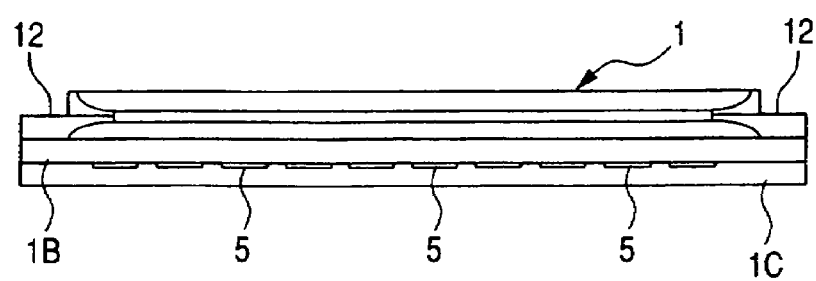
FIG. 13 is a side view of the multi-function memory card according to one embodiment of the present invention.

As shown in FIGS. 12 and 13, the multi-function memory card 1 of this embodiment has the corner section at both sides of one side, that is the leading edge when inserted into the slot of the cellular phone, processed into a round shape. This round process is provided not only on the corner section at the back face of the cap 1B but also on the corner section at the front face of the cap 1B where the guide channels 11 are formed. For example, the radius of curvature ($R_1$) at the back face of the cap 1B is 1.5 mm and the radius of curvature ($R_2$) at the front face having the guide channels 11 formed thereon is 1.0 mm.

On the other hand, the round process whose radius of curvature is great as described above is not provided on the corner section at both sides of one side that is the trailing edge when the multi-function memory card 1 is inserted into the slot. Accordingly, there is a great difference of shape between the leading edge and the trailing edge of the cap 1B, whereby the position of the leading edge can easily be discriminated at a glance when the multi-function memory card 1 is inserted into the slot. Further, the corner section having the round shape with great radius of curvature provides easy rotation when it comes in contact with the inner wall of the connector. Therefore, even if the insertion angle is shifted sideways, smooth insertion can be achieved. It is desirable to set the radius of curvature ($R_1$, $R_2$) greater than at least the width of the guide channel 12 (W=0.55 mm) in order to surely obtain the aforesaid effect.

Figure 14:
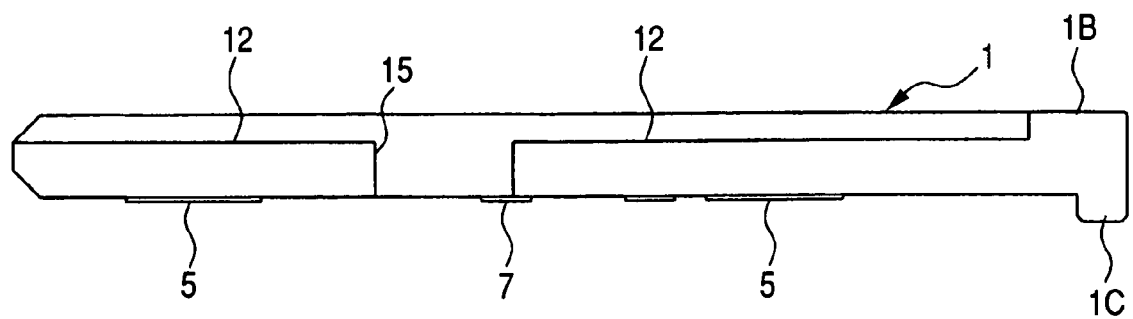
FIG. 14 is a side view of the multi-function memory card according to one embodiment of the present invention.

As shown in FIG. 14, a chamfering process is provided on one side of the cap 1B that is the leading edge when the multi-function memory card 1 is inserted into the slot of the cellular phone, whereby the sectional shape of this leading edge is formed into a taper shape. This allows a smooth insertion even if the insertion angle is shifted in the vertical direction when the multi-function memory card 1 is inserted into the slot.

Figure 15:
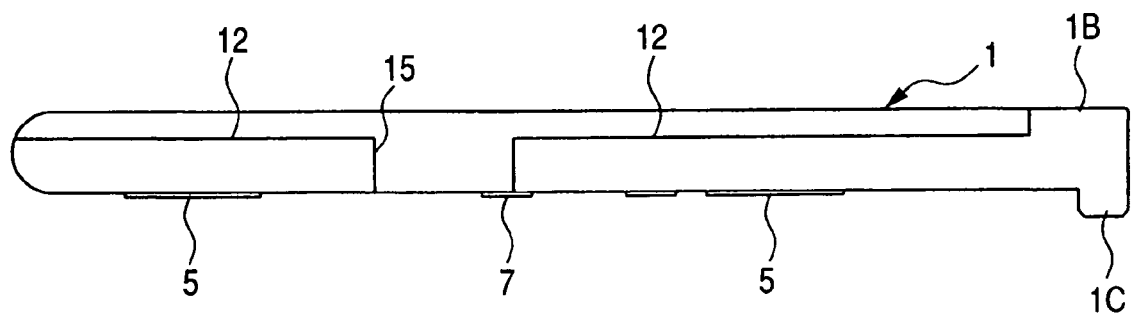
FIG. 15 is a side view of the multi-function memory card according to one embodiment of the present invention.

Although the above-mentioned chamfering process may be provided on either one side at the front face or at the back face of the cap 1B, great effect can be obtained by providing the chamfering process on both faces. Further, as the chamfering dimension ($C_1$) becomes greater, the greater effect can be obtained. Therefore, it is desirable, for example, that the chamfering dimension ($C_1$) is set greater than the chamfering dimension ($C_2$) of the convex section 1C formed at the trailing edge of the cap 1B. As shown in FIG. 15, the round process may be provided on the leading edge instead of the chamfering process. In this case too, the insertion is made easy as the radius of curvature is set great.

As disclosed in FIG. 14 or FIG. 15, the removing operation of the card and the inserting operation of the card can both be facilitated by the sectional shape at the leading edge of the card having a greater chamfer or greater radius of curvature compared to the sectional shape of the corner section at the terminal side of the convex section 1C.

Figure 16:
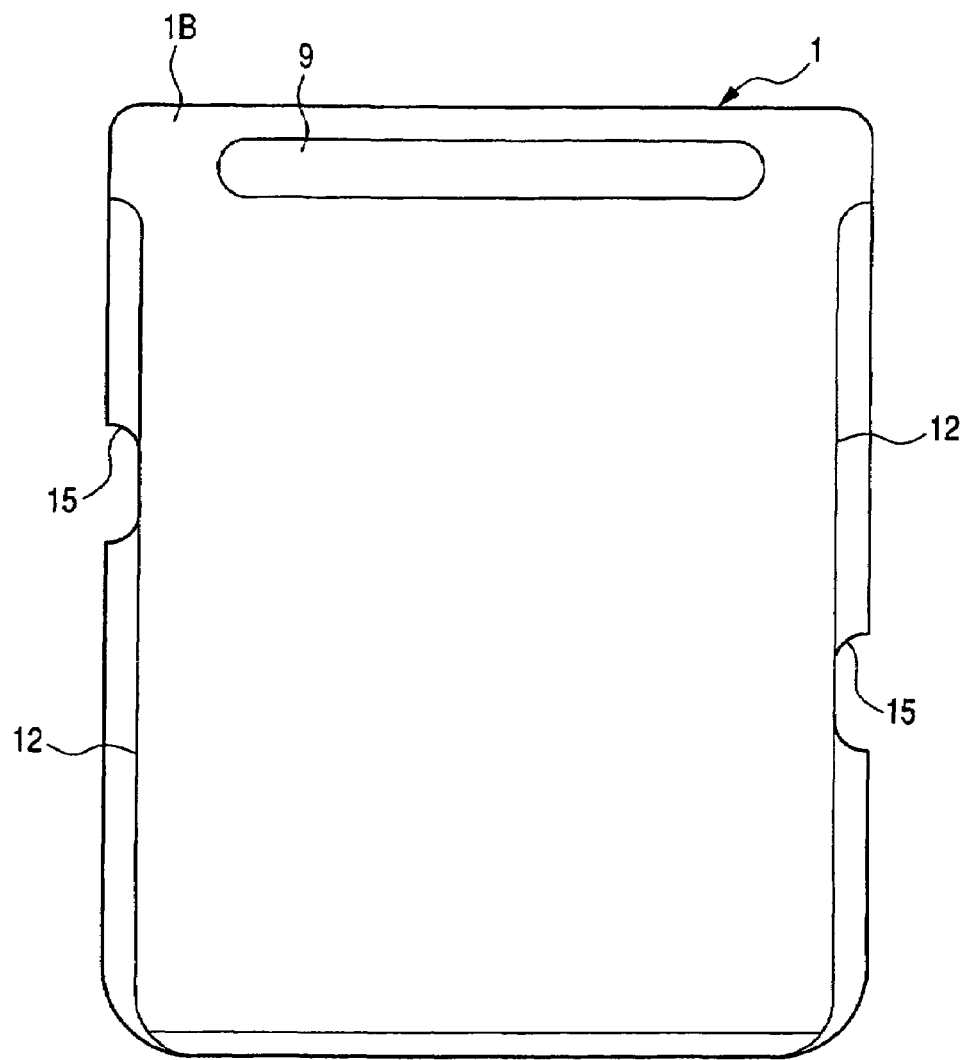
FIG. 16 is a plan view showing a front face of a multi-function memory card according to one embodiment of the present invention.
Figure 17:
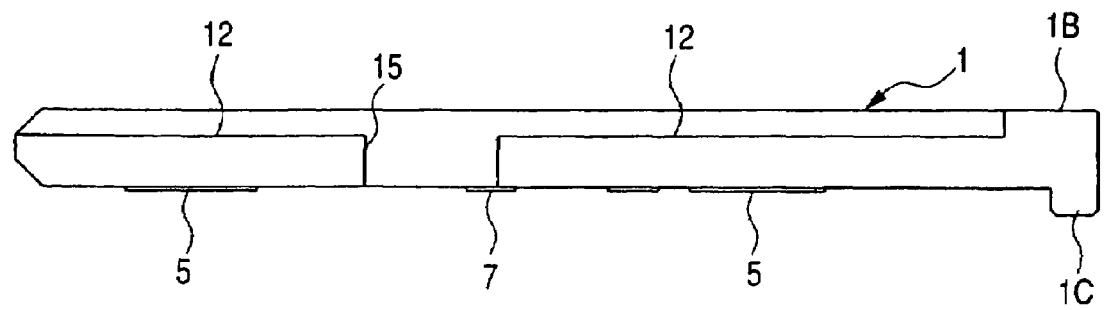
FIG. 17 is a side view of the multi-function memory card according to one embodiment of the present invention.

As shown in FIG. 16 and FIG. 17, the multi-function memory card 1 in this embodiment is provided with notch channels 15 at both side faces (both side faces at the long sides) of the cap 1B. Each of the notch channels 15 is a semi-elliptic or rectangle channel extending toward the back face from the front face of the cap 1B, one end of which ends at the surface of the guide channel 12. The notch channel may be formed on only one side of the cap.

As described above, the external connection terminals 5 are arranged in two rows on the back face of the multi-function memory card 1. Therefore, when the terminals 11 of the connector 10 that should be connected to the external connection terminals 5 at the back row mistakenly come in contact with the external connection terminals 5 at the front row on the way of inserting or removing the multi-function memory card 1 into or from the connector 10, unsuitable signal is inputted into the circuit of the semiconductor chips (3C, 3F, 3M) to cause an error. To put it in an extreme way, the circuit may be broken down.

The multi-function memory card 1 according to this embodiment is composed of the cap 1B whose surface is made of a resin, so that static electricity is likely to occur. Therefore, when the multi-function memory card 1 is inserted into the connector 10, there is a fear that static electricity charged on the cap 1B enters the semiconductor chips (3C, 3F, 3M) through the terminals 11 of the connector 10. In view of this, the lengths of two external connection terminals 5 composing the power supply terminal (Vcc) and ground terminal (Vss) are made longer than those of the other external connection terminals 5 as described above to supply power to the semiconductor chips (3C, 3F, 3M) as quick as possible, whereby charges flown into the semiconductor chips (3C, 3F, 3M) through the other external connection terminals 5 are passed into the power supply terminal (Vcc) or ground terminal (Vss). However, if the static electricity enters the semiconductor chips (3C, 3F, 3M) before power is supplied to the semiconductor chips (3C, 3F, 3M) due to the erroneous contact with the terminal 11 that is non-corresponding to the external connection terminal 5, an ESD protection element provided at each semiconductor chips (3C, 3F, 3M) cannot sufficiently function, so that it cannot eliminate ESD charges, thereby breaking down the circuit. Further, if the erroneous contact with the terminal 11 that is non-corresponding to the external connection terminal 5 occurs when the multi-function memory card 1 is removed with the power of the cellular phone turned ON, an unsuitable signal is supplied to the semiconductor chips (3C, 3F, 3M), thereby causing a malfunction such as a write error.

The notch channels 15 provided at both side faces of the cap 1B are for preventing the erroneous contact with the terminal 11 that is non-corresponding to the external connection terminal 5 when the multi-function memory card 1 is inserted into or removed from the slot of the cellular phone.

As shown in FIG. 18, among the terminals 11 formed in the connector 10 into which the multi-function memory card 1 is to be inserted, the terminals 11 that should be connected to the external connection terminals 5 at the back row are controlled to be in contact with or not to be in contact with the external connection terminals 5 by a cam 16 fixed to its one end section. As shown in FIG. 18(a), when the multi-function memory card 1 is inserted into the connector 10, the tip end of the cam 16 is brought into contact with the guide channel 12 of the cap 1B to be pushed downward, and with this downward movement, the terminals 11 that should be connected to the external connection terminals 5 at the back row are pushed downward. The cam 16 is urged upward by a spring not shown provided at its one section, but its upward movement is restricted during when its tip end is brought into contact with the guide channel 12. Accordingly, when the external connection terminals 5 at the front row pass above these terminals 11, the tip end of the cam 16 is set to be in contact with the guide channel 12, whereby the external connection terminals at the front row passing above these terminals 11 does not come in contact with these terminals 11, since they are pushed downward. Next, as shown in FIG. 18(b), when the leading edge of the multi-function memory card 1 is fully inserted into the connector 10, the external connection terminals 5 at the front row reach the position of the connector 10 that should be connected to them and the external connection terminals 5 at the back row reach the position above the terminals 11 that should be connected to them. In this case, the notch channel 15 formed at the side face of the cap 1B reaches the position of the tip end of the cam 16, whereby the tip end of the cam 16 is not in contact with the guide channel 12. By this, the cam 16 whose upward movement is restricted by the guide channel 12 is lifted upward by spring force, whereby the terminals 11 lifted upward with the movement of the cam 16 are brought into contact with the external connection terminals 5 at the back row.

On the other hand, when the multi-function memory card 1 inserted into the connector 10 is removed, the tip end of the cam 16 fitted into the notch channel 15 is firstly pushed downward by the contact with the guide channel 12, and with this movement, the terminals 11 that are in contact with the external connection terminals 5 at the back row are pushed downward, resulting in being non-contact with the external connection terminals 5. Accordingly, the erroneous contact with the terminals 11 that are non-corresponding to the external connection terminals 5 can surely be prevented, like the case of the insertion.

Note that the aforesaid notch channel 15 may be formed on only one side face at only one place, but the movement of the cam 16 can be controlled with high precision by providing the notch channel 15 at both side faces of the cap 1B.

The multi-function memory card 1 thus constructed as described above has an advantage of having a relatively simple manufacturing process and high productivity. Specifically, the card body 1A can be mass-produced with a simple process wherein the semiconductor chips (3C, 3F, 3M) are mounted on the above-mentioned large wiring substrate to perform a wire-bonding, and after the semiconductor chips (3C, 3F, 3M) are encapsulated with the mold resin 4, the large wiring substrate is diced. Therefore, productivity is extremely high. Further, the above-mentioned concave section 1C, guide channel 12, notch channel 15 or round process or chamfering process can simply be realized by molding the cap 1B made of a thermoplastic resin. The operation for housing the card body 1A into the cap 1B is extremely simple, since both are only bonded.

On the other hand, if the additional process is performed to the card body 1A obtained from the large wiring substrate to form the concave section 1C, guide channel 12 or notch channel 15, or the round process and chamfering process are performed to the card body 1A, the manufacturing process becomes more complicated, thereby reducing productivity. On the other hand, the manufacturing process becomes extremely simple in the case where the convex section 1C, guide channel 12 or notch channel 15 is formed or the round process or chamfering process is performed by using the die that is used for encapsulating the semiconductor chips mounted on the wiring substrate with the mold resin. However, the hard mold resin made of a thermosetting resin is exposed to the outside, thereby not avoiding the problem of shortening the service life of the connector or deteriorating the connection reliability with the connector.

Embodiment 2

Figure 19:
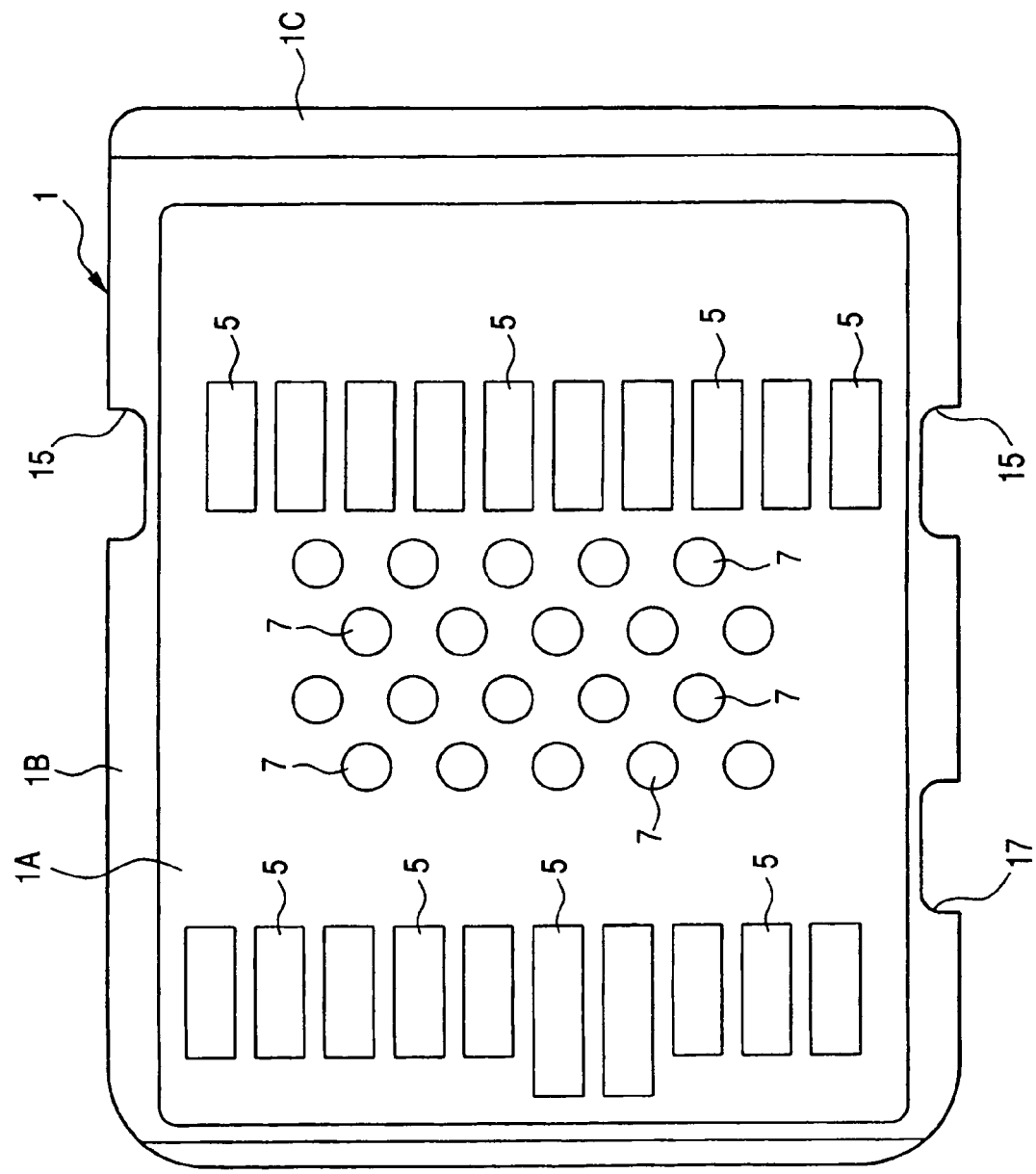
FIG. 19 is a plan view showing an outer appearance of a back face of a multi-function memory card according to another embodiment of the present invention.
Figure 20:
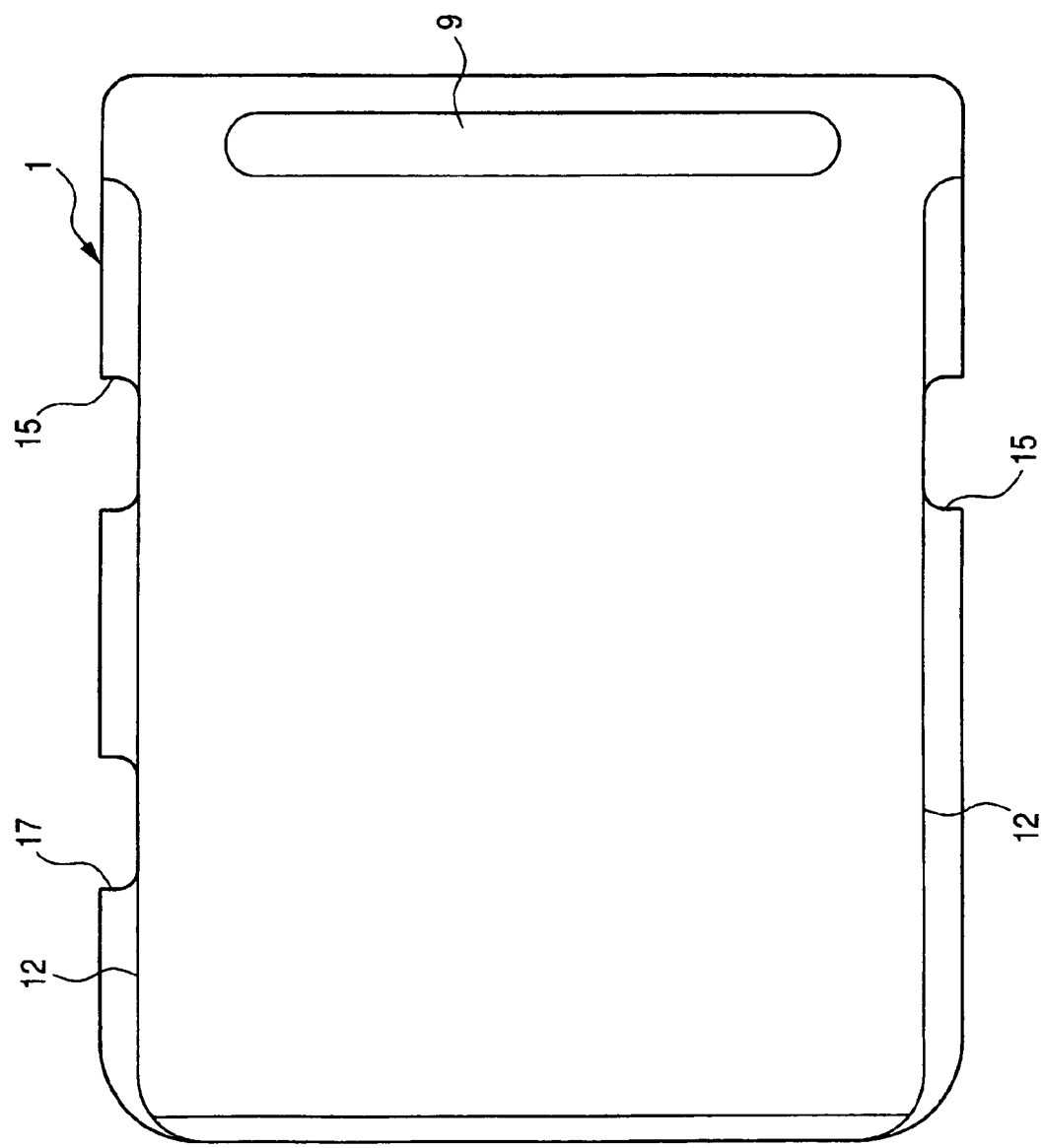
FIG. 20 is a plan view showing an outer appearance of a front face of the multi-function memory card according to another embodiment of the present invention.

FIGS. 19 and 20 are plan views showing the outer appearance of the multi-function memory card according to this embodiment, in which FIG. 19 shows a face (back face) where the external connection terminals are formed and FIG. 20 shows its opposite face (front face).

In the multi-function memory card 1 according to this embodiment, the notch channels 15 formed at both side faces of the cap 1B are arranged in the vicinity of the external connection terminals 5 at the back row. Specifically, two notch channels 15 are positioned so as to be shifted toward the trailing edge of the cap 1B compared to the embodiment 1 and further, they are arranged so as to be equally spaced from the trailing edge of the cap 1B.

As described above, the notch channel 15 is provided for preventing the erroneous contact with the terminals 11 that are non-corresponding to the external connection terminals 5 when the multi-function memory card 1 is inserted into or removed from the slot of the cellular phone. Preventing the erroneous contact with the terminals can prevent the malfunction such as the write error as well as prevent the short-circuit or damage of the driver circuit of the input/output interface.

Figure 21:
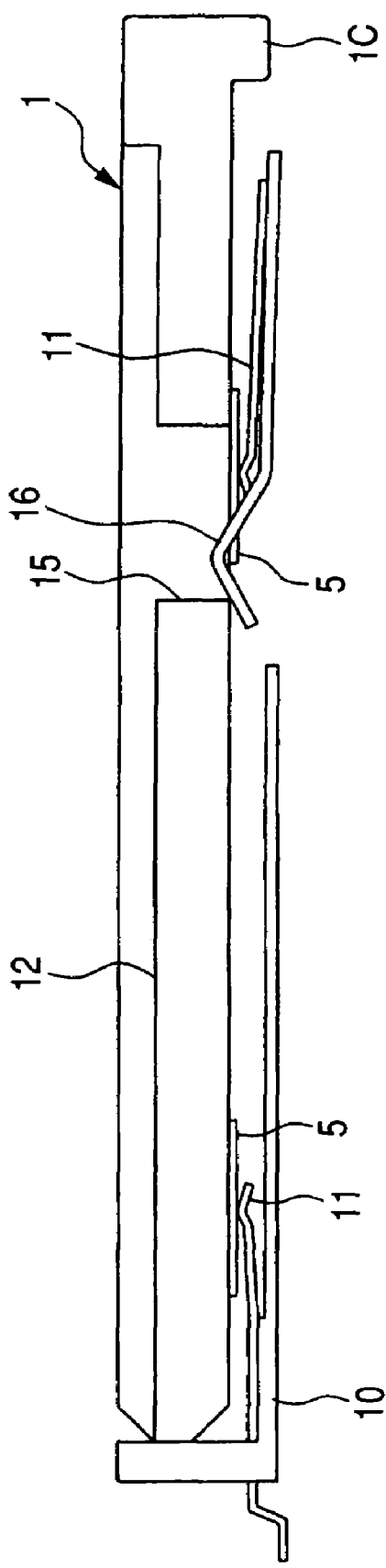
FIG. 21 is a view for explaining an erroneous contact preventing mechanism of the external connection terminals of the multi-function memory card according to another embodiment of the present invention and the connector terminals at the memory card slot.

When the notch channels 15 are arranged close to the trailing edge of the cap 1B, the arm length of the cam 16, that controls the contact or non-contact with the terminals 11 provided in the connector 10 into which the multi-function memory card 1 is inserted, can be made shorter that that of the embodiment 1 (see FIG. 18) as shown in FIG. 21. This enables the compact-designed cam mechanism in the connector 10, thereby being capable of miniaturizing the connector 10. Further, the back face of the multi-function memory card 1 is difficult to be inclined with respect to the face having the terminals formed thereon of the connector 10, since two notch channels 15 are arranged so as to be equally spaced from the trailing edge of the cap 1B. Therefore, the external connection terminals 5 at the back row and the terminals 11 of the connector 10 can be brought into uniform contact with each other. It is preferable that the notch channels 15 are arranged at the position close to the trailing edge with respect to the external connection terminals 5 at the front row and closer to the external connection terminals 5 at the back row than to the external connection terminals 5 at the front row.

Further, the multi-function memory card 1 according to this embodiment is provided with a slip-preventing channel 17 having almost the same shape of the notch channel 15 at one side face of the cap 1B. This slip-preventing channel 17 is arranged close to the leading edge of the cap 1B with respect to the notch channel 15.

Figure 22:
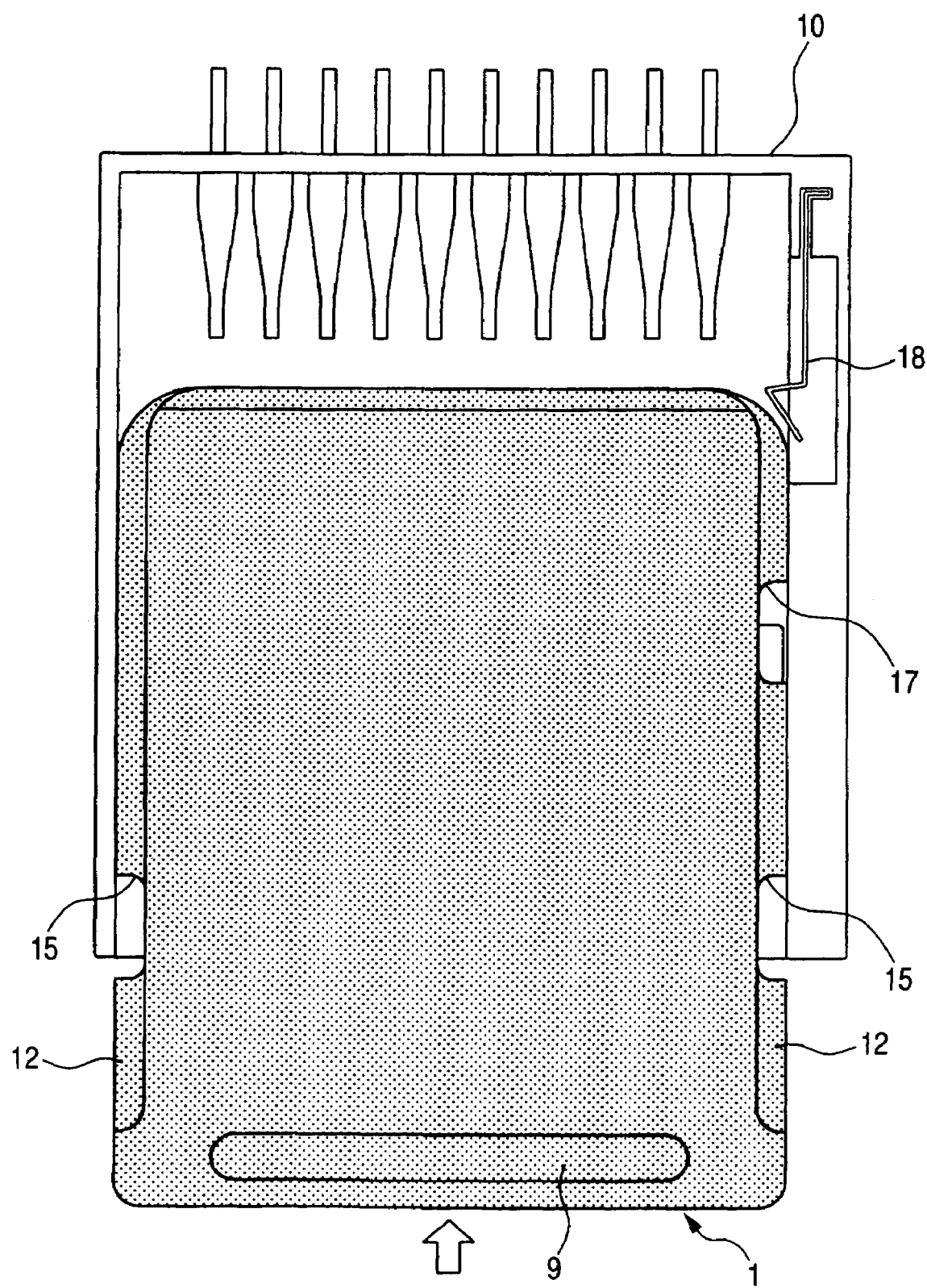
FIG. 22 is a plan view showing a state in which the multi-function memory card according to another embodiment of the present invention is inserted into the connector.
Figure 23:
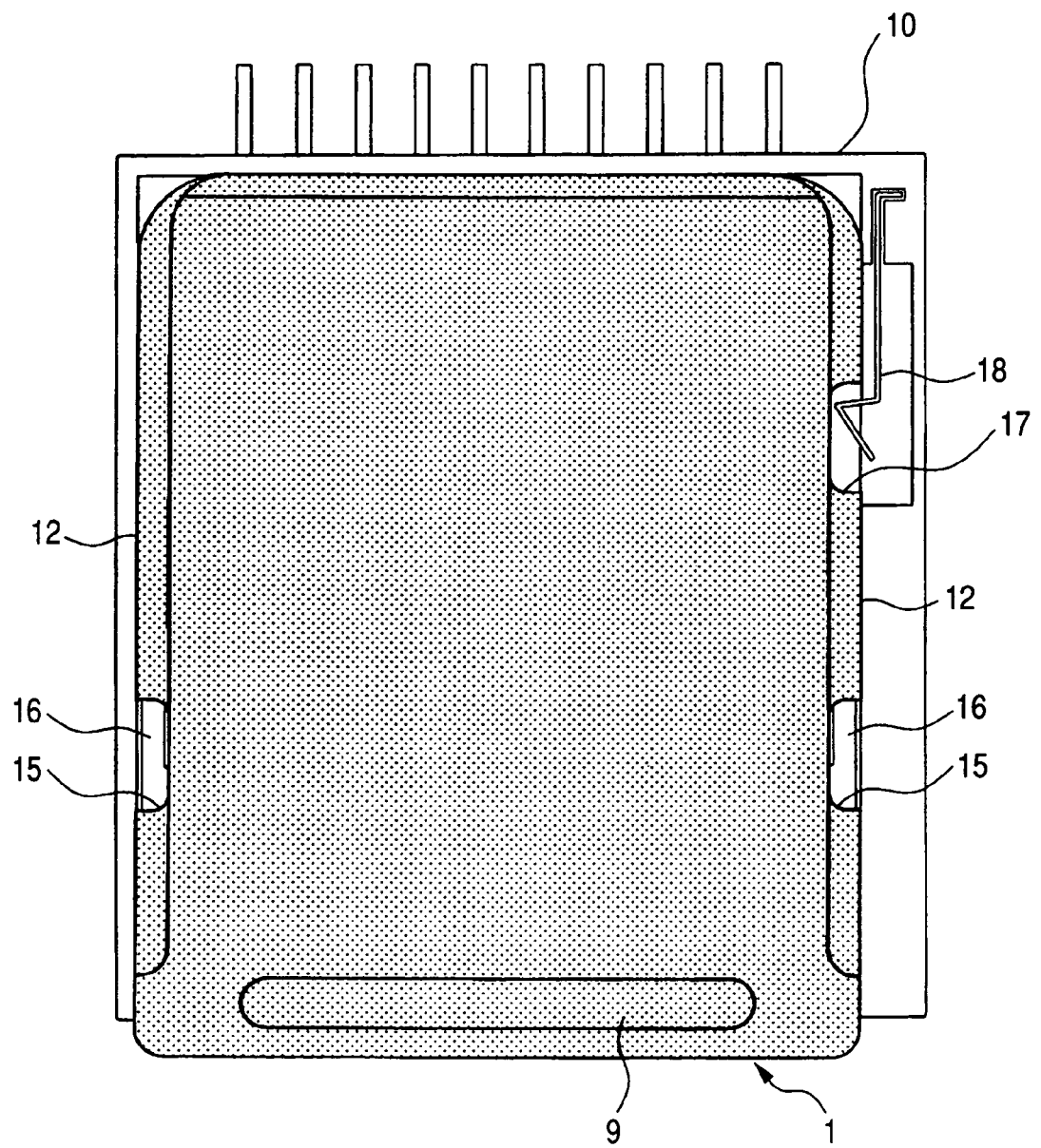
FIG. 23 is a plan view showing a state in which the multi-function memory card according to another embodiment of the present invention is inserted into the connector.
Figure 24:
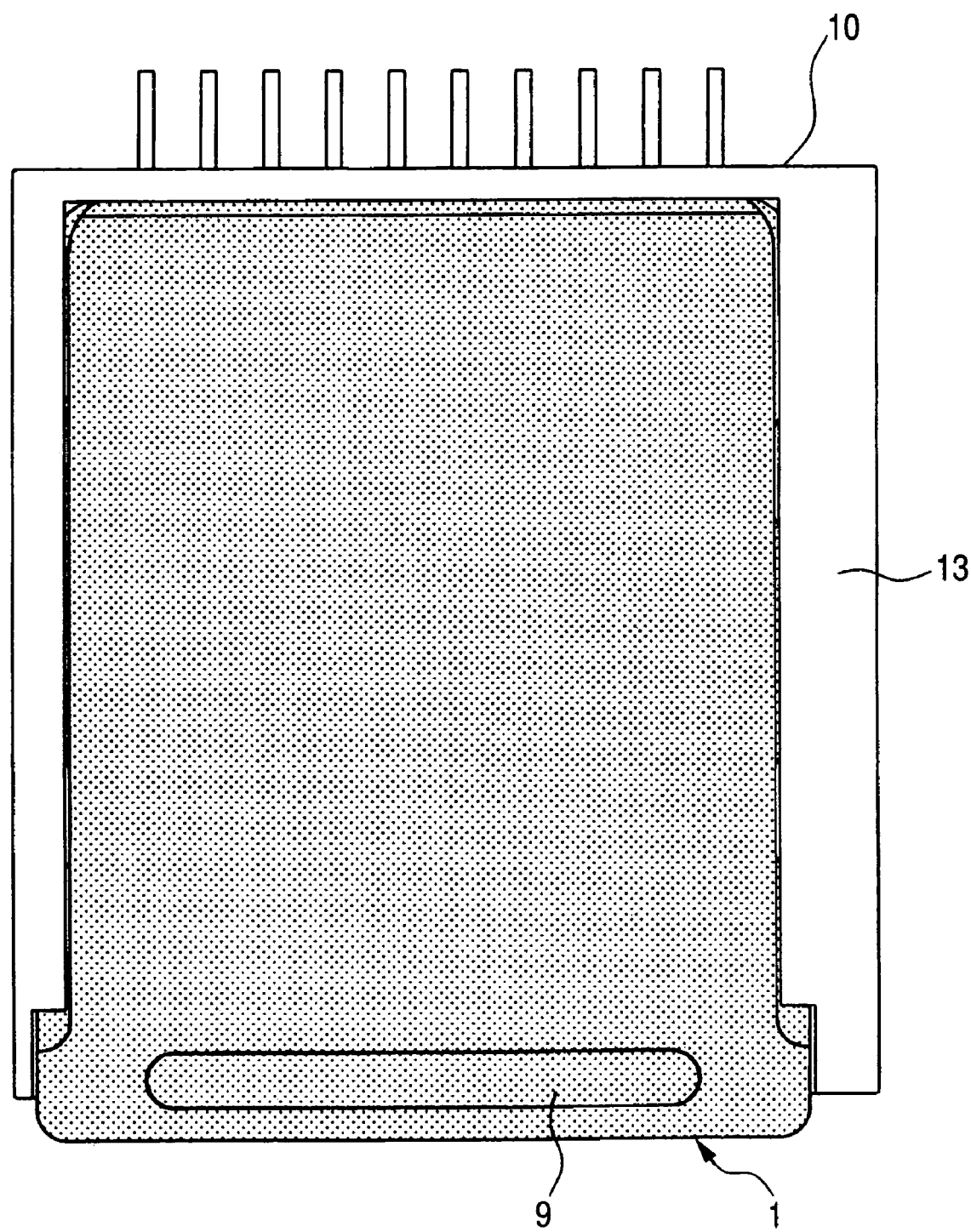
FIG. 24 is a plan view showing a state in which the multi-function memory card according to another embodiment of the present invention is inserted into the connector.

FIGS. 22 to 24 are plan views each showing a state in which the multi-function memory card 1 is inserted into the connector 10. Note that the top plate 13 of the connector 10 is not shown in FIGS. 22 and 23.

A slip-preventing crawl 18 is provided at one side face of the connector 10. As shown in FIG. 23, when the leading edge of the multi-function memory card 1 is inserted to the end of the connector 10, the tip end of the slip-preventing crawl 18 is fitted into the slip-preventing channel 17. Providing the slip-preventing mechanism described above can prevent the multi-function memory card 1 from easily falling off from the connector 10.

Like the multi-function memory card 1 in the embodiment 1, the multi-function memory card 1 according to this embodiment is provided with the step guide channel 12 at two side faces (two side faces at long sides) on the face of the cap 1B where a label is stuck. The notch channel 15 and the slip-preventing channel 17 are formed by cutting out a portion of the guide channel 12. By adopting such structure, there is no chance that the cam 16 in the notch channel 15 or the slip-preventing crawl 18 in the slip-preventing channel 17 protrudes over the guide channel 12. Therefore, when the multi-function memory card 1 is inserted into the connector 10, the back face of the cap 1B and the top face of the top plate 13 are equal in height (see FIG. 9). The guide channel 12 is provided at the back face of the cap 1B and the notch channel 15 and the slip-preventing channel 17 are formed at a portion of the guide channel 12, thereby being capable of decreasing the thickness of the connector 10.

Moreover, almost all surface of the guide channel 12 is covered with the top plate 13. Since the guide channel 12 is formed continuously from the leading edge to the vicinity of the trailing edge of the cap 1B, almost all of both side faces of the multi-function memory card 1 is covered with the top plate 13 as shown in FIG. 24, when the multi-function memory card 1 is installed to the connector 10. Accordingly, even when the notch channel 15 and the slip-preventing channel 17 are formed at the guide channel 12 and the cutout 14 is formed at the top plate 13 in order that the back face of the cap 1B and the top face of the top plate 13 have the same height, the area for holding the multi-function memory card 1 is easy to be secured by the top plate 13, whereby the multi-function memory card 1 can surely be installed to the connector 10. It is preferable that the guide channel 12 extends longer toward the trailing edge compared to the external connection terminals 5 at the back row. Since the guide channel 12 extending longer toward the trailing edge compared to the external connection terminals 5 at the back row, the top plate 13 covering the guide channel 12 stabilizes the position of the external connection terminals 5 at the back row, thereby being capable of stabilizing the connection with the connector 10.

Subsequently explained is a method for attaching the card body 1A to the cap 1B of the multi-function memory card 1.

Figure 25:
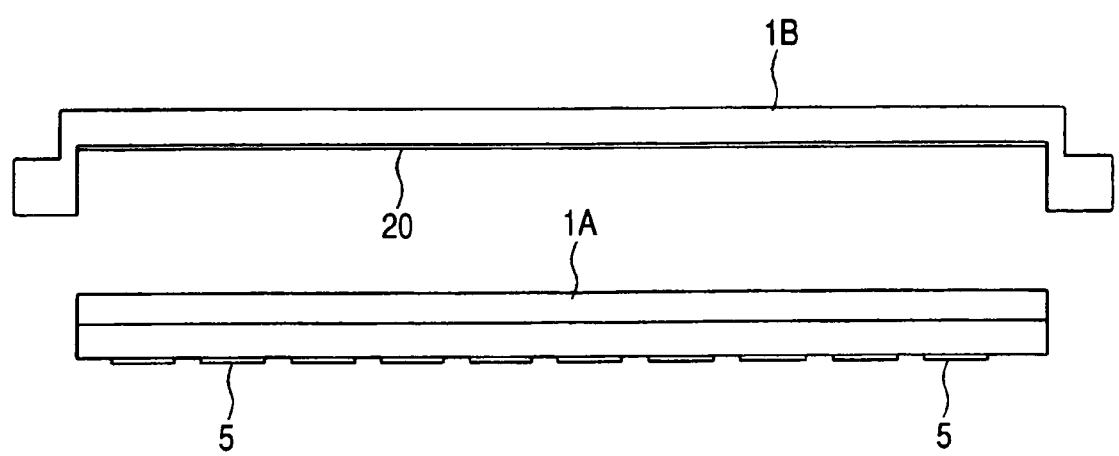
FIG. 25 is a view for explaining a method for attaching a card body of the multi-function memory card according to another embodiment of the present invention to a cap.
Figure 26:
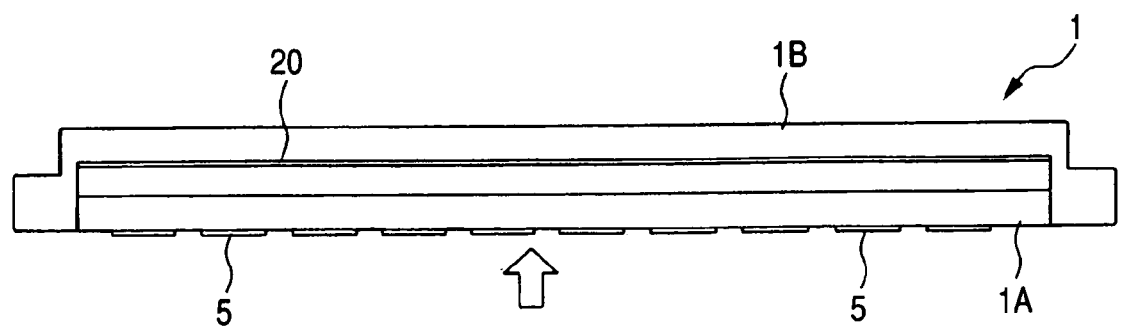
FIG. 26 is a view for explaining a method for attaching the card body of the multi-function memory card according to another embodiment of the present invention to a cap.

The first method is that, as shown in FIG. 25, an adhesive 20 is applied beforehand on the back face of the cap 1B and the card body 1A is fitted into the cap 1B as shown in FIG. 26. In this case, the adhesive 20 may be applied on the card body 1A. However, this method requires a measure for holding the card body 1A with any method to prevent the card body 1A from falling off from the cap 1B until the adhesive 20 is hardened after the card body 1A is fitted into the cap 1B. Therefore, this method takes much time to attach the card body 1A to the cap 1B.

Figure 27:
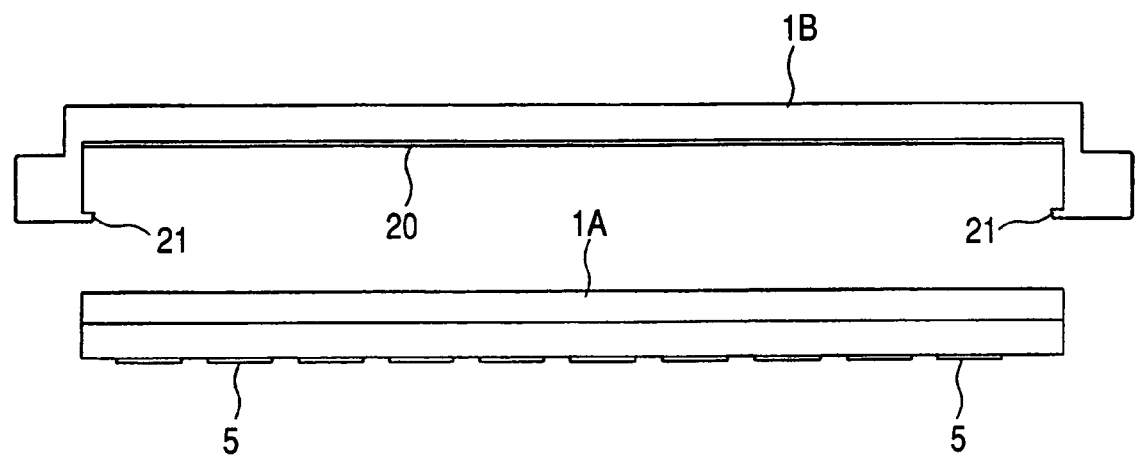
FIG. 27 is a view for explaining a method for attaching the card body of the multi-function memory card according to another embodiment of the present invention to a cap.
Figure 28:
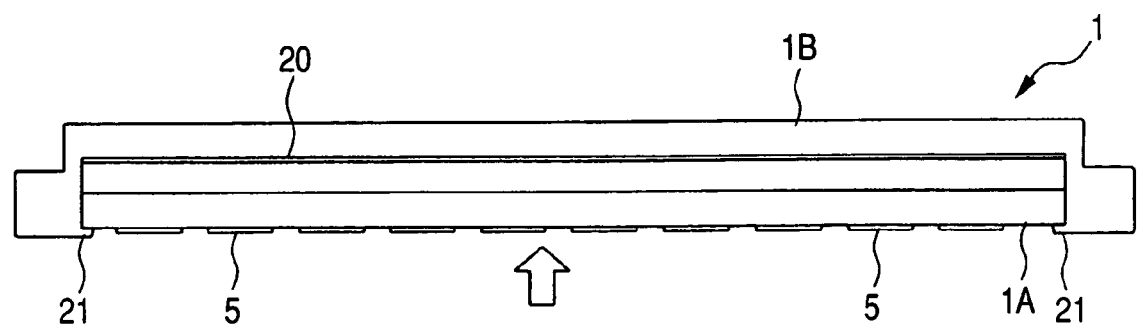
FIG. 28 is a view for explaining a method for attaching the card body of the multi-function memory card according to another embodiment of the present invention to a cap.

In view of this, as shown in FIG. 27, a resinous projection 21 is formed beforehand around the channel of the cap 1B made of a thermoplastic resin, wherein the card body 1A is pushed into the channel of the cap 1B by utilizing the elastic deformation of the projection 21 as shown in FIG. 28. This allows the card body 1A to be held by the projection 21, not requiring the measure for preventing the card body 1A from falling off from the cap 1B until the adhesive 20 is hardened. The projection 21 can be resin-molded integral with the cap 1B.

Figure 29:
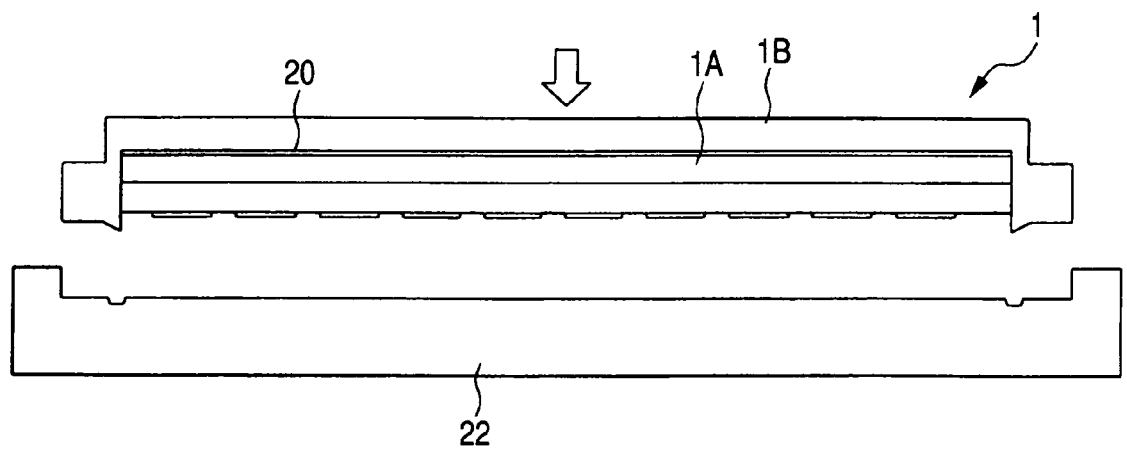
FIG. 29 is a view for explaining a method for attaching the card body of the multi-function memory card according to another embodiment of the present invention to a cap.
Figure 30:
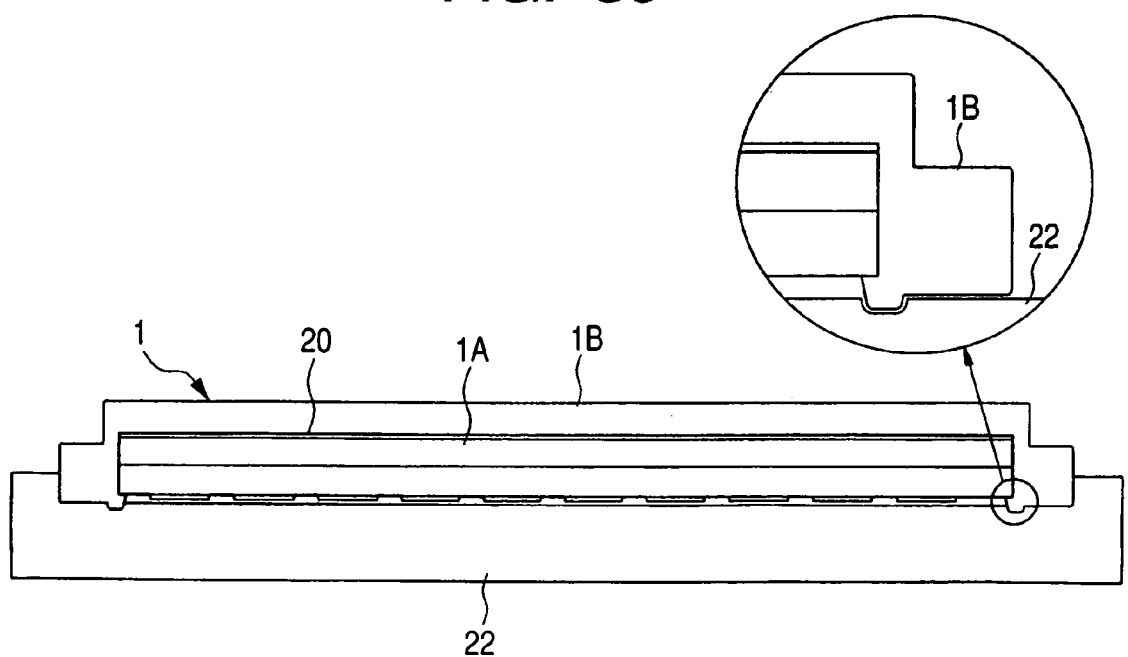
FIG. 30 is a view for explaining a method for attaching the card body of the multi-function memory card according to another embodiment of the present invention to a cap.

Further, as shown in FIGS. 29 and 30, for example, a caulking method may be adopted wherein the surroundings of the channel of the cap 1B is softened and deformed by using a jig 22 provided with an ultrasonic generating mechanism after the card body 1A is fitted into the cap 1B by a general method, to thereby fit the card body 1A into the cap 1B. It should be noted that the process for applying the adhesive 20 can be omitted in the case of adopting the method shown in FIGS. 27 to 30.

Embodiment 3

Figure 31:
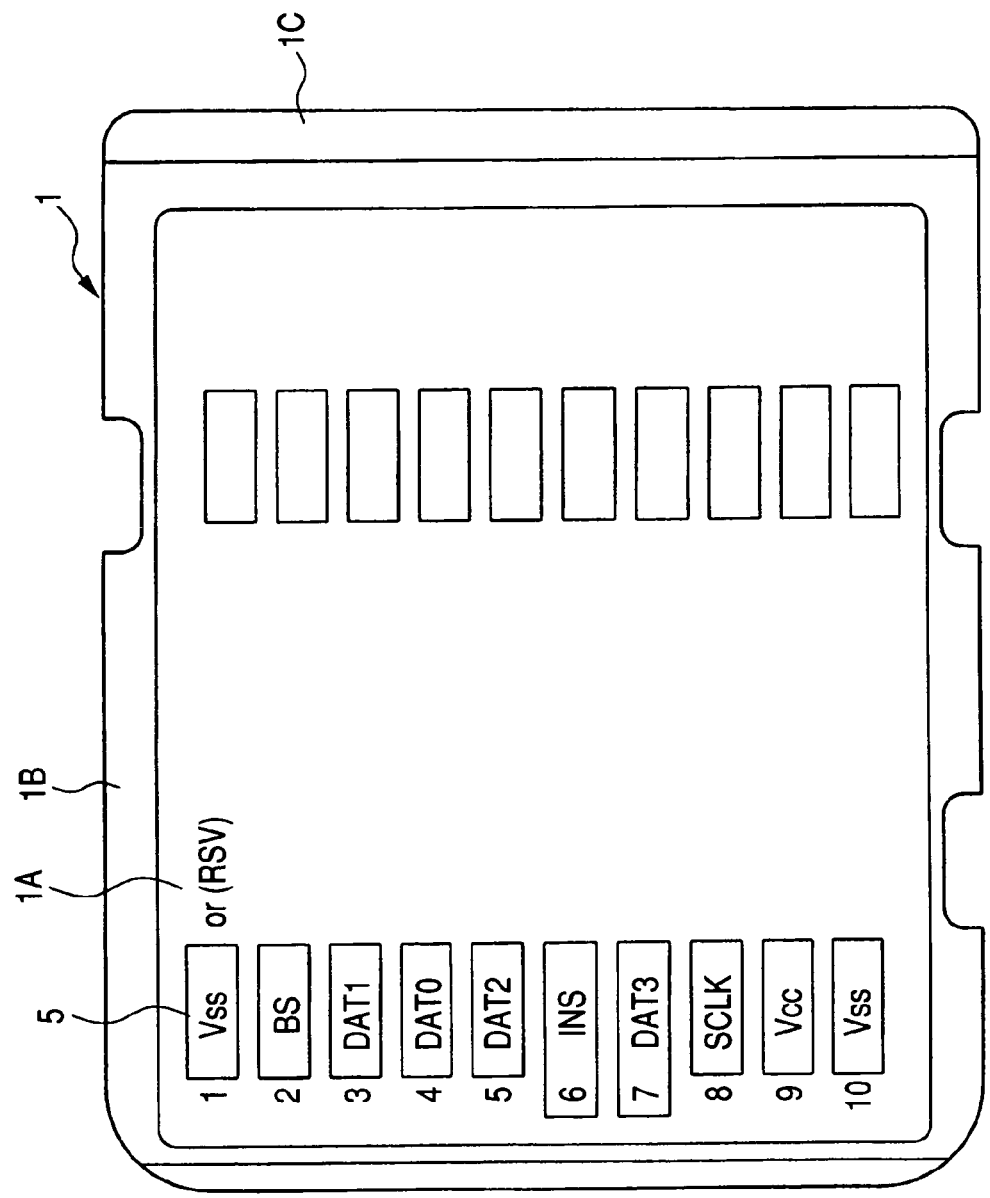
FIG. 31 is a plan view showing an arrangement of the external connection terminals of the multi-function memory card according to another embodiment of the present invention.
Figure 32:
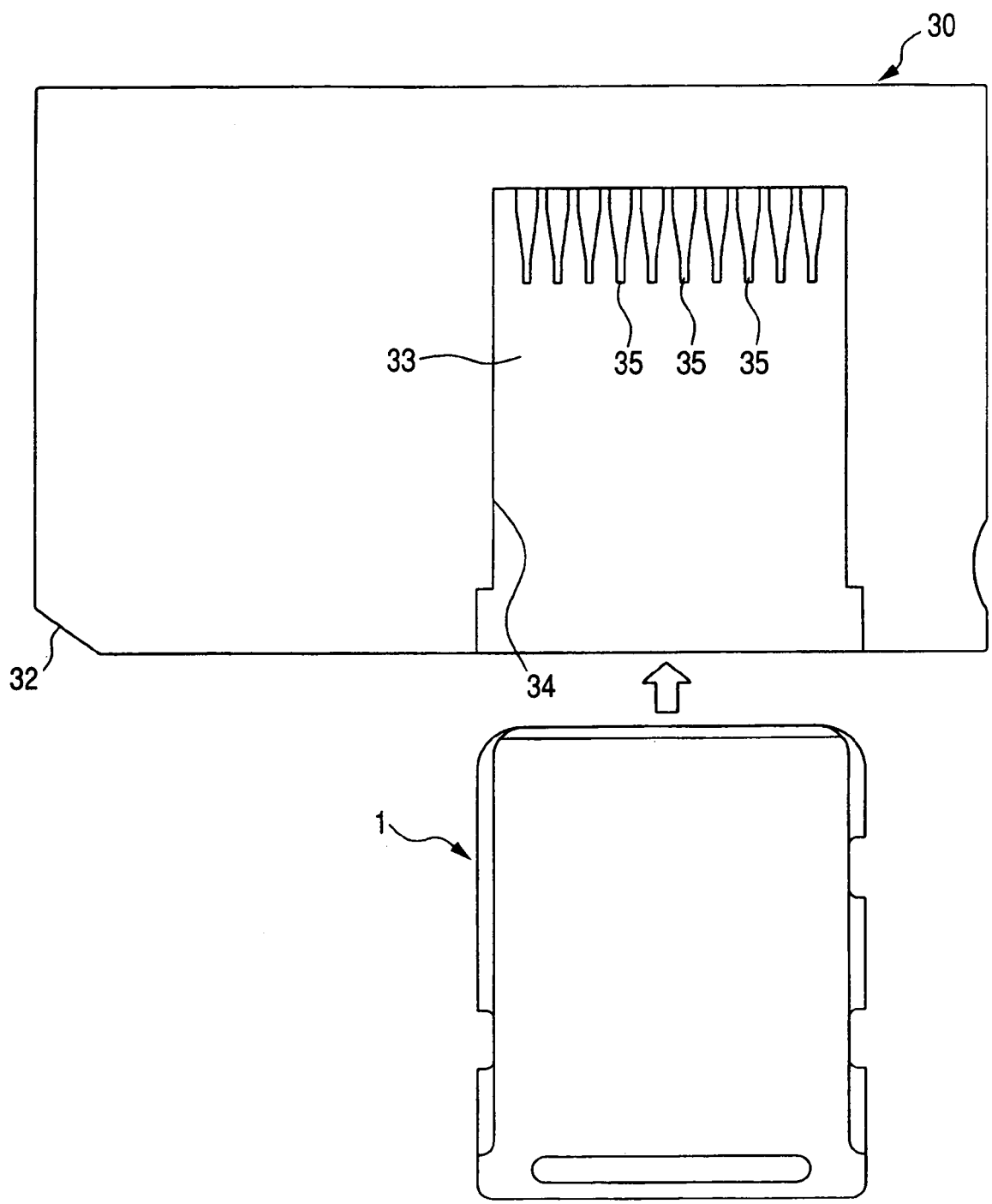
FIG. 32 is a plan view showing an outer appearance of a front face of an adaptor to which the multi-function memory card according to another embodiment of the present invention is inserted.
Figure 33:
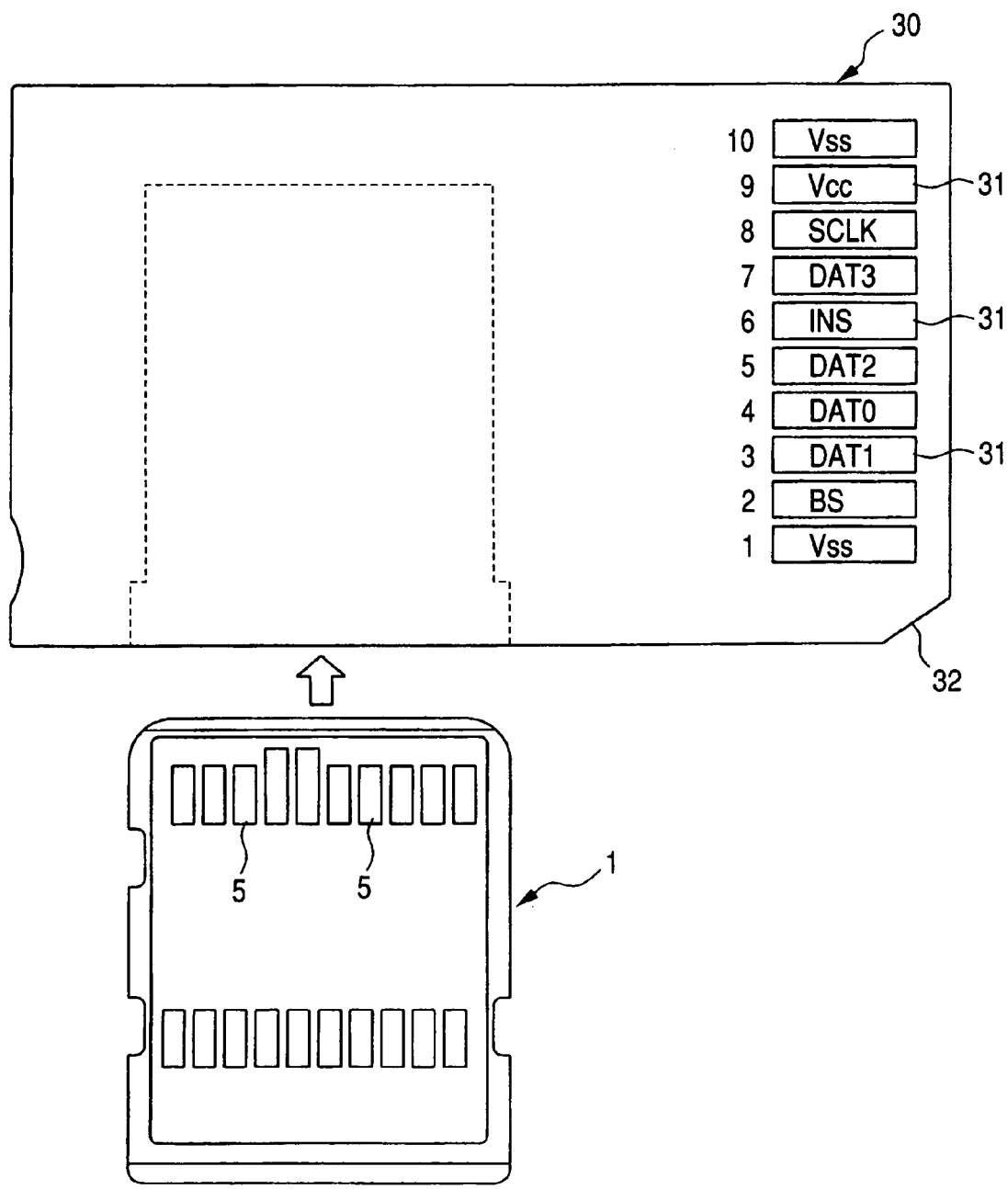
FIG. 33 is a plan view showing an outer appearance of a back face of the adaptor to which the multi-function memory card according to another embodiment of the present invention is inserted.

FIG. 31 is a plan view of the multi-function memory card according to this embodiment wherein the arrangement of the external connection terminals 5 are changed in order to provide interchangeability to a memory card of different type having different standard, and FIGS. 32 and 33 are plan views of an adaptor to which this multi-function memory card is inserted, in which FIG. 32 shows a front face side and FIG. 33 shows a back face side (the face on which the external connection terminals are formed).

The adaptor 30 shown in FIG. 32 and FIG. 33 has an outer dimension and external connection terminals 31 same as those of a memory card (hereinafter simply referred to as memory stick) called "Memory Stick Duo" manufactured by Sony Corporation in order to provide interchangeability with this memory stick. The memory stick has ten external connection terminals, so that the adaptor 30 also has ten external connection terminals 31 (#1 to #10). In the multi-function memory card 1 according to this embodiment used as inserted into this adaptor 30, only ten external connection terminals 5 (#1 to #10) positioned at the leading edge when inserted into the adaptor 30 are used and ten external connection terminals 5 positioned at the trailing edge are not used. Ten external connection terminals 5 positioned at the trailing edge can be used as an extension terminal of the memory stick or as a terminal for a function other than the memory stick.

The adaptor 30 is made of a resin component having a rectangular plane shape. A cutout 32 is formed at one of four corner sections. The adaptor 30 is inserted into a card slot of a cellular phone with the short side provided with this cutout 32 directing toward the leading edge.

The adaptor 30 has incorporated therein a connector 33 into which the multi-function memory card 1 is inserted. As shown in FIG. 32, a cutout 34 for the connector 33 is formed on the front face of the adaptor 30, wherein the labeled face of the multi-function memory card 1 inserted into the connector 33 is exposed on the front face.

The connector 33 has a structure similar to that of the connector 10 in the embodiments 1 and 2 except that the number of the terminal 35 is ten. It is reduced in size in order that the labeled face of the multi-function memory card 1 becomes equal in height to the front face of the adaptor 30.

Figure 34:
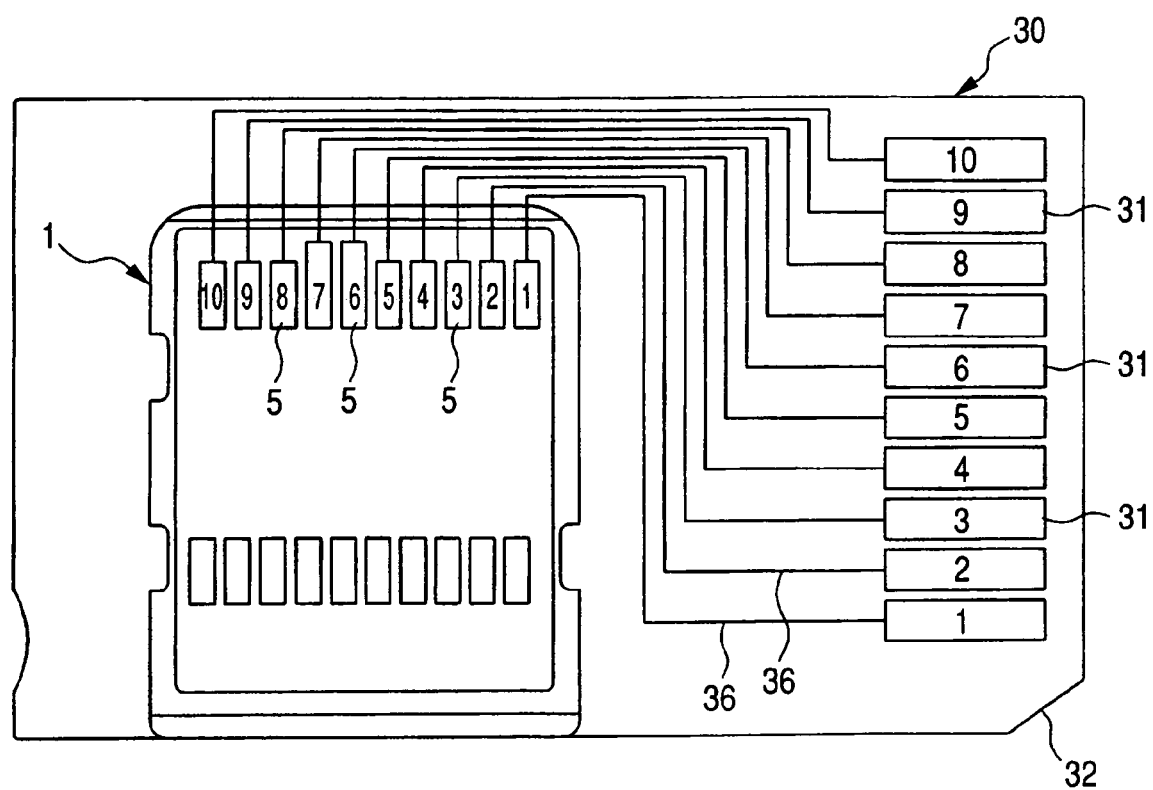
FIG. 34 is a plan view showing a pattern of wirings for connecting the external connection terminals of the multi-function memory card and the corresponding external connection terminals at the adaptor.

Upon inserting the multi-function memory card 1 into the adaptor 30, the direction of the multi-function memory card 1 is determined such that ten external connection terminals 5 of the multi-function memory card 1 do not cross wirings 36 that connects ten external connection terminals 5 and corresponding ten external connection terminals 31 at the adaptor 30 as shown in FIG. 34.

Since the opening section for the connector 33 is arranged at its long side (the side parallel to the inserting direction) in the adaptor 30, there is no chance that the multi-function memory card 1 is exposed from the card slot of the cellular phone when the multi-function memory card 1 is inserted into the card slot. Accordingly, there is no chance that the multi-function memory card 1 is mistakenly removed from the adaptor 30 or the multi-function memory card 1 falls off from the adaptor 30.

Figure 35:
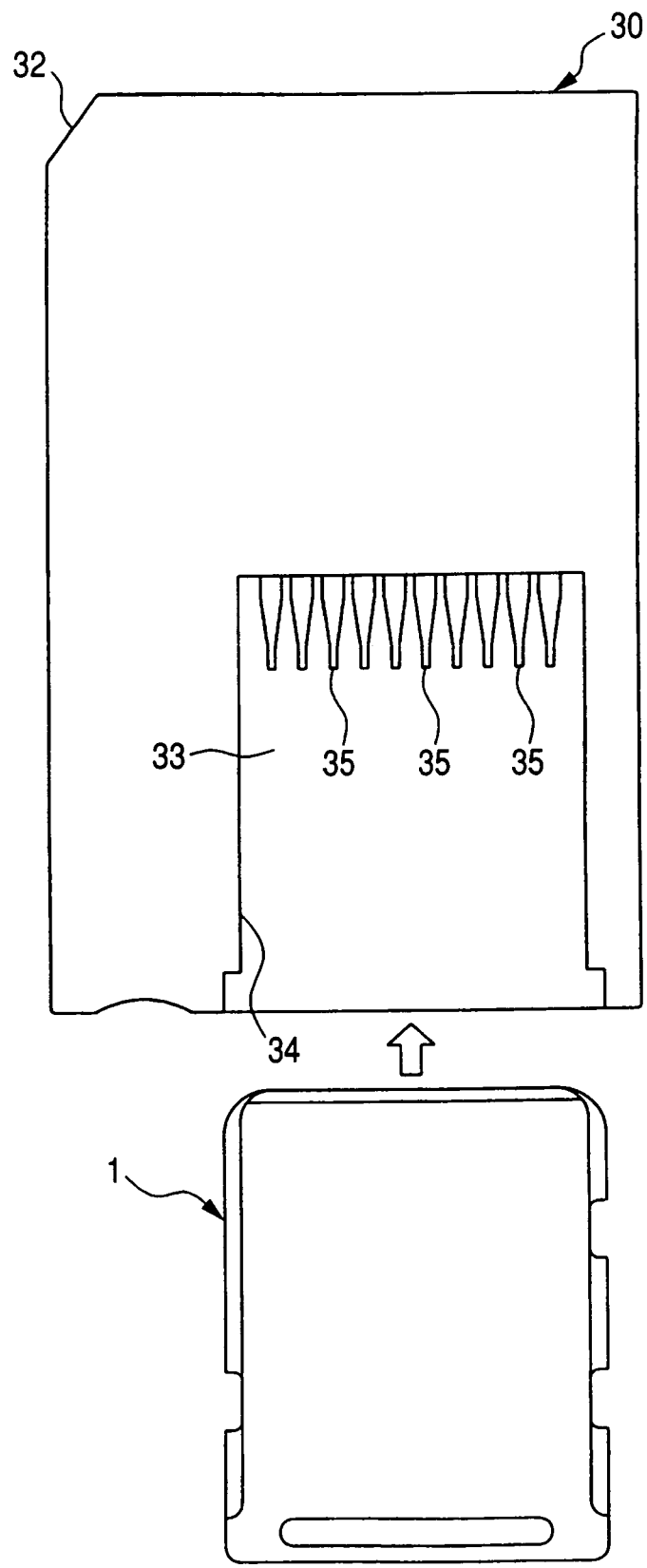
FIG. 35 is a plan view showing an arrangement of an opening section of a connector provided at the adaptor to which the multi-function memory card according to another embodiment of the present invention is inserted.

When the opening section for the connector 33 is arranged at the short side at the trailing edge of the adaptor 30 as shown in FIG. 35, there is a possibility that the multi-function memory card 1 is pulled out from the adaptor 30 even when the adaptor 30 is inserted into the card slot of the cellular phone. In this case, the slip-preventing crawl 18 explained in the embodiment 2 may be provided at the connector 33 of the adaptor 30 in order to prevent the disadvantage that the multi-function memory card 1 falls off from the adaptor 30.

Figure 36:
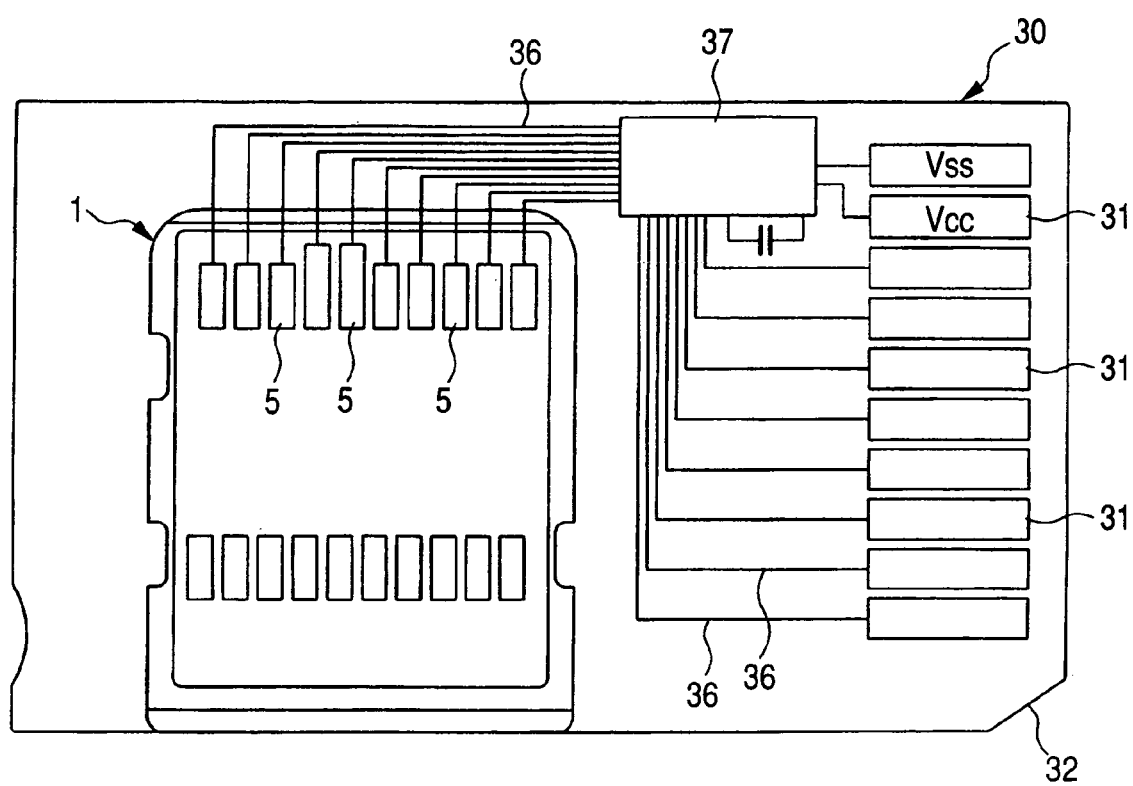
FIG. 36 is a plan view showing a protection chip provided at the adaptor to which the multi-function memory card according to another embodiment of the present invention is inserted.

To provide for the case where the power is suddenly shut off during the use of the cellular phone, an IC circuit (protection chip 37) for detecting the shutoff of power and a condenser for supplying emergency power may be incorporated between the terminals of the multi-function memory card 1 and the power supply terminals (Vcc, Vss) of the adaptor 30 as shown in FIG. 36. According to this, a signal reporting the shutoff of the power or a command for starting a forced termination is given to the semiconductor chips in the multi-function memory card 1 from the protection chip 37 and emergency power (Vcc, Vss) can be supplied through the protection chip 37, when the battery of the cellular phone is discharged or the adaptor 30 is mistakenly removed from the card slot of the cellular phone, thereby being capable of preventing the malfunction of the semiconductor chips.

The invention achieved by the present inventors has specifically been explained above based upon the embodiments, but the invention is not limited to the above-mentioned embodiments and various modifications are of course possible without departing from the invention's spirit and scope.

Although the above-mentioned embodiments describe the multi-function memory card having a memory card function and IC card function, the card is not limited to the one having these functions. For example, the present invention can be applied to a card having various functions such as a card having only a memory card function, a card having only an IC card function, a card including a semiconductor chip having a function different from the memory card function or IC card function, or the like. Various modifications are possible in the type, number and combination of the semiconductor chips mounted on the wiring substrate according to the function of the card. For example, as for a card having only a memory card function, its system can be configured by one or plural memory chips having formed thereon an electrically erasable and writable non-volatile memory and an interface controller chip for controlling the memory interface operation to the memory chip. Further, various modifications are also possible in the number of the external connection terminals 5. For example, all external connection terminals 5 can be formed in one row when the required number of the external connection terminal 5 is small.

A memory card according to the present invention can realize diverse functions by changing a type or combination of semiconductor chips mounted on a wiring substrate of a card body, whereby it can widely be applied to not only a multi-function memory card but also other multi-function card, communication card, I/O card or the like.

What is claimed is:

1. A memory device including a memory card which comprises:

a plate-like card body including a wiring substrate having a first face and a second face, wherein a plurality of semiconductor chips are mounted over the second face of the wiring substrate, a plurality of external connection terminals are formed on the first face of the wiring substrate, and the semiconductor chips are encapsulated with resin; and a plate-like cap member having a recess to house the card body, the recess being formed in a first face of the cap member, wherein the card body is housed in the recess of the cap member such that the first face of the wiring substrate is exposed, and the cap member further includes a convex section that projects, in a thickness direction of the memory card, from the first face of the cap member at a trailing edge of the cap member as considered with respect to a direction of card insertion, wherein guide channels are formed in opposite side edge portions of the cap member, wherein the guide channels extend inward, in the thickness direction of the memory card, from a second face of the cap member, wherein respective notch channels are formed at portions of said guide channels, wherein, in the thickness direction of the memory card, the notch channels pass through the cap member, and wherein the semiconductor chips include a first semiconductor chip having formed therein an electrically erasable and writable non-volatile memory and a second semiconductor chip having formed therein an interface controller to control a memory interface operation to the non-volatile memory.

2. A memory device according to claim 1,
wherein the second semiconductor chip and the first semiconductor chip are laminated to be mounted over the second face of the wiring substrate.

3. A memory device according to claim 2, wherein the plurality of semiconductor chips further include a third semiconductor chip having formed therein an IC card microcomputer as a security controller to perform a security process according to an operation command given from the interface controller.

4. A memory device according to claim 1, wherein the cap member is formed of a resin whose friction resistance with a connector terminal is lower than that of the resin encapsulating the semiconductor chips.

5. A memory device according to claim 4, wherein the resin of the cap member is a thermoplastic resin and the resin encapsulating the semiconductor chips is a thermosetting resin.

6. A memory device according to claim 1, wherein the external connection terminals include a first terminal group arranged along a direction perpendicular to the card insertion direction and a second terminal group arranged along the direction perpendicular to the card insertion direction and spaced from the first terminal group along the card insertion direction.

7. A memory device according to claim 1,
wherein a leading edge of the cap member is formed to have a rounded shape,
wherein a corner section of the convex section has a rounded shape, and
wherein the rounded shape of the leading edge of the cap member has a greater radius than the rounded shape of the corner section of the convex section.

8. A memory device according to claim 7,
wherein the guide channels are formed such that the width of the first face of the cap member is greater than the width of the second face of the cap member.

9. A memory device according to claim 1, wherein a radius of curvature at corner sections of a leading edge side of the cap member is greater than a radius of curvature at corner sections of a trailing edge side of the cap member.

10. A memory device according to claim 8, wherein a radius of curvature at corner sections of a leading edge side of the cap member is greater than the width of each said guide channel.

11. A memory device according to claim 1,
wherein the plurality of external connection terminals includes a first terminal group arranged along a direction perpendicular to the card insertion direction and a second terminal group arranged along the direction perpendicular to the card insertion direction and spaced from the first terminal group along the card insertion direction, and wherein a distance between at least one notch channel and the second terminal group is smaller than the distance between said one notch channel and the first terminal group.

12. A memory device according to claim 11,
wherein the notch channels include a pair of notch channels equally spaced from the trailing edge of the cap member.

13. A memory device according to claim 12, wherein the notch channels include a slip-preventing channel to prevent the memory card from slipping out of a connector.

14. A memory device according to claim 1, wherein the card body is caulked in the recess of the cap member.

15. A memory device according to claim 1, further comprising an adaptor including a connector to which the memory card is connected and external connection terminals to which the external connection terminals of the card body are electrically coupled.

16. A memory device according to claim 15, wherein a cutout section of the connector is arranged in the direction perpendicular to an insertion direction of the adaptor.

17. A memory device according to claim 15, wherein the adaptor has a built-in power-supply element to supply power to the semiconductor chips of the memory card.

18. A memory device including a memory card which comprises:
a substrate having a front surface and a rear surface opposite to the front surface;
a first flash memory chip mounted over the front surface of the substrate;
a controller chip for the first flash memory chip mounted over the front surface of the substrate;
a plurality of external connection terminals arranged over the rear surface of the substrate;
a mold resin covering the first flash memory chip and the controller chip; and
a case covering the mold resin and the front surface of the substrate;
wherein a convex section is formed on a trailing edge portion of the case as considered with respect to an insertion direction of the memory card,
the convex section projects from a rear surface of the case in a thickness direction of the memory card,
first channels are formed in opposite side edge portions of the case,
the first channels extend inward, in the thickness direction of the memory card, toward the rear surface of the case,
at least one second channel is formed at a part of each of the first channels, and
the second channels pass through the case in the thickness direction of the memory card.

19. A memory card according to claim 18, wherein the controller chip is mounted over the first flash memory chip.

20. A memory card according to claim 18, further comprising a second flash memory chip mounted over the front surface of the substrate.

21. A memory card according to claim 18, further comprising an IC card microcomputer chip having a function of a security controller to perform a security process according to an operation command given from the controller chip.

22. A memory card according to claim 18, wherein the case is formed of a resin whose friction resistance with a connector terminal is lower than that of the mold resin.

23. A memory card according to claim 22, wherein the case resin is a thermoplastic resin, and the mold resin is a thermosetting resin.

24. A memory card according to claim 18, wherein the external connection terminals are arranged along a direction perpendicular to the card insertion direction.

25. A memory card according to claim 18, wherein the external connection terminals include a first terminal group arranged along a direction perpendicular to the card insertion direction and a second terminal group arranged along the direction perpendicular to the card insertion direction and spaced from the first terminal group along the card insertion direction.

26. A memory card according to claim 18, wherein a radius of curvature at corner sections of a leading edge side of the case is greater than a radius of curvature at corner sections of a trailing edge side of the case.

27. A memory card according to claim 18,
   wherein two said second channels are provided at parts of one of said first channels.

* * * * *